(12) United States Patent
Umemoto et al.

(10) Patent No.: US 11,107,909 B2
(45) Date of Patent: Aug. 31, 2021

(54) SEMICONDUCTOR DEVICE

(71) Applicant: Murata Manufacturing Co., Ltd., Kyoto-fu (JP)

(72) Inventors: Yasunari Umemoto, Nagaokakyo (JP); Isao Obu, Nagaokakyo (JP); Kaoru Ideno, Nagaokakyo (JP); Shigeki Koya, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 44 days.

(21) Appl. No.: 16/436,674

(22) Filed: Jun. 10, 2019

(65) Prior Publication Data
US 2019/0386122 A1 Dec. 19, 2019

(30) Foreign Application Priority Data

Jun. 15, 2018 (JP) .............................. JP2018-114345

(51) Int. Cl.
| | | |
|---|---|---|
| *H01L 29/737* | (2006.01) | |
| *H01L 29/423* | (2006.01) | |
| *H01L 29/417* | (2006.01) | |
| H01L 29/08 | (2006.01) | |
| H01L 29/06 | (2006.01) | |

(52) U.S. Cl.
CPC .... *H01L 29/7371* (2013.01); *H01L 29/41708* (2013.01); *H01L 29/42304* (2013.01); *H01L 29/0692* (2013.01); *H01L 29/0817* (2013.01)

(58) Field of Classification Search
CPC .......... H01L 29/7371; H01L 29/42304; H01L 29/41708; H01L 29/0692; H01L 29/0817; H01L 29/0813
USPC .................. 257/197, 198; 438/235, 309, 312
See application file for complete search history.

(56) References Cited

U.S. PATENT DOCUMENTS

| | | | |
|---|---|---|---|
| 2003/0075737 A1 | 4/2003 | Kawasaki et al. | |
| 2005/0205892 A1* | 9/2005 | Yanagihara et al. ......................... | |
| | | | H01L 29/812 |
| | | | 257/409 |

FOREIGN PATENT DOCUMENTS

| | | |
|---|---|---|
| JP | 2005-101402 A | 4/2005 |
| JP | 2005-243897 A | 9/2005 |
| JP | 2013-219081 A | 10/2013 |

\* cited by examiner

*Primary Examiner* — Thinh T Nguyen

(74) *Attorney, Agent, or Firm* — Studebaker & Brackett PC

(57) ABSTRACT

A collector layer, a base layer, and an emitter layer that are disposed on a substrate form a bipolar transistor. An emitter electrode is in ohmic contact with the emitter layer. The emitter layer has a shape that is long in one direction in plan view. A difference in dimension with respect to a longitudinal direction of the emitter layer between the emitter layer and an ohmic contact interface at which the emitter layer and the emitter electrode are in ohmic contact with each other is larger than a difference in dimension with respect to a width direction of the emitter layer between the emitter layer and the ohmic contact interface.

8 Claims, 25 Drawing Sheets

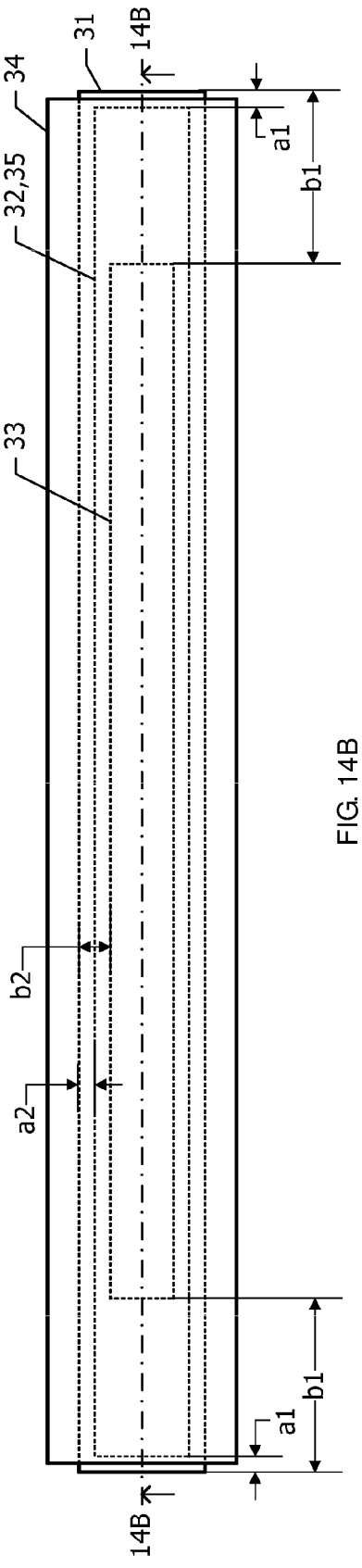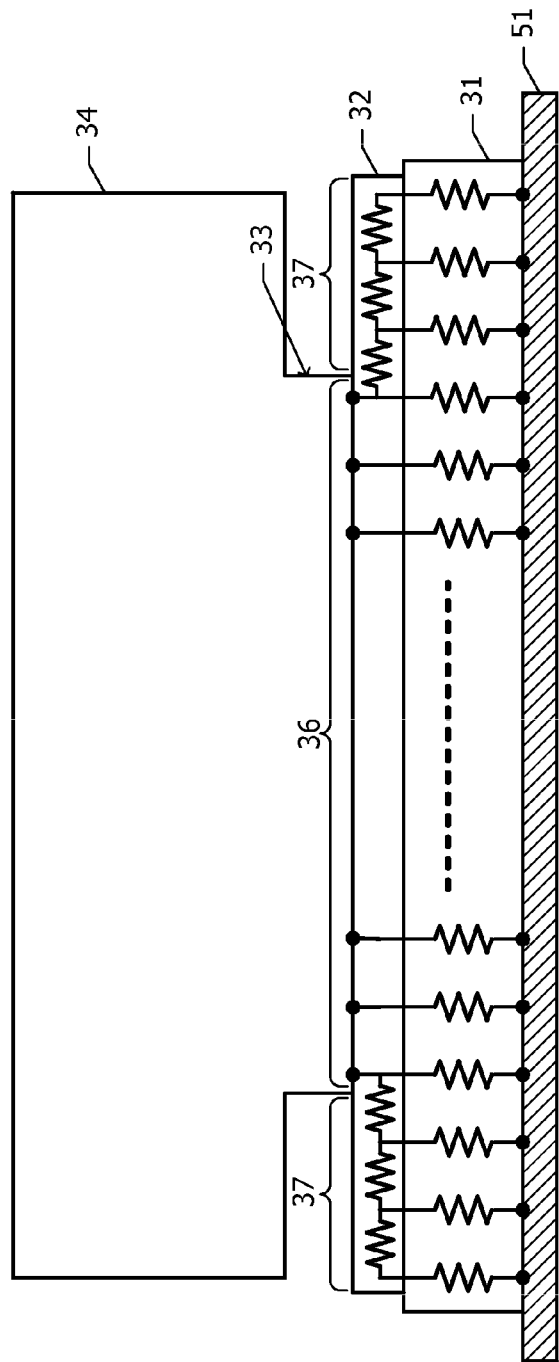

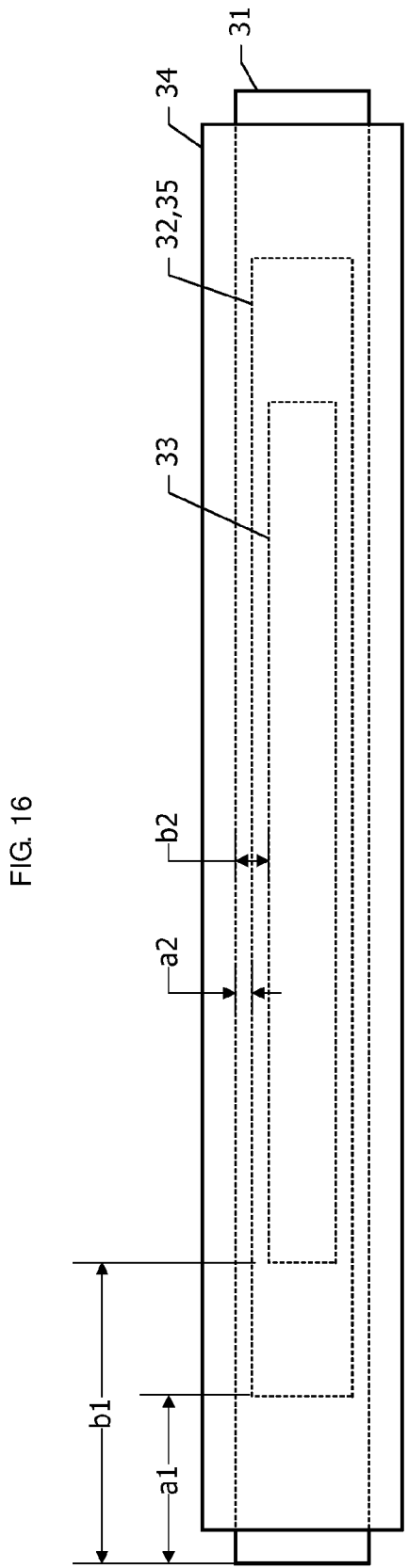

SEMICONDUCTOR DEVICE

CROSS-REFERENCE TO RELATED APPLICATION

This application claims benefit of priority to Japanese Patent Application No. 2018-114345, filed Jun. 15, 2018, the entire content of which is incorporated herein by reference.

BACKGROUND

Technical Field

The present disclosure relates to a semiconductor device.

Background Art

Heterojunction bipolar transistors (HBTs) are mainly used as active elements that form a power amplifier module of a mobile terminal as described, for example, in Japanese Unexamined Patent Application Publication No. 2005-101402. Desirable characteristics required for the HBTs are items such as high efficiency, high gain, high output, and high breakdown voltage. In envelope tracking systems, which have recently attracted attention, HBTs that operate at a high collector voltage are required. In order to realize high-voltage operation of HBTs, it is necessary to extend the safe operating area (SOA).

SUMMARY

When a collector voltage of an HBT is increased in a graph showing collector current-collector voltage characteristics (Ic-Vce characteristics), a boundary line (SOA line) between the inside and the outside of a range of the SOA gradually decreases. According to evaluation experiments conducted by the inventors of the present application, a phenomenon that the SOA line discontinuously decreases at a certain collector voltage was found to occur. The collector voltage at which the SOA line discontinuously decreases is referred to as a "transition voltage".

At an operating voltage that is substantially equal to or higher than the transition voltage, the risk that the actual operating range becomes out of the range of the SOA increases when a change in the load occurs during the operation of an HBT. If the operating range is out of the range of the SOA, the HBT may be damaged. It is desirable to extend the SOA by increasing the transition voltage so that the HBT is operated at a high collector voltage without being damaged even if a change in the load occurs.

Accordingly, the present disclosure provides a semiconductor device in which the SOA can be extended by increasing the transition voltage.

According to an aspect of the present disclosure, there is provided a semiconductor device including a collector layer, a base layer, and an emitter layer that are disposed on a substrate to form a bipolar transistor; and an emitter electrode that is in ohmic contact with the emitter layer. The emitter layer has a shape that is long in one direction in plan view. A difference in dimension with respect to a longitudinal direction of the emitter layer between the emitter layer and an ohmic contact interface at which the emitter layer and the emitter electrode are in ohmic contact with each other is larger than a difference in dimension with respect to a width direction of the emitter layer between the emitter layer and the ohmic contact interface.

According to another aspect of the present disclosure, there is provided a semiconductor device including a collector layer, a base layer, and an emitter layer that are disposed on a substrate to form a bipolar transistor; an emitter electrode that is in ohmic contact with the emitter layer; and an emitter wiring line connected to the emitter electrode through a contact hole formed in an insulating film. The emitter layer has a shape that is long in one direction in plan view. A difference in dimension with respect to a longitudinal direction of the emitter layer between the emitter layer and the contact hole is larger than a difference in dimension with respect to a width direction of the emitter layer between the emitter layer and the contact hole.

According to still another aspect of the present disclosure, there is provided a semiconductor device including a collector layer, a base layer, and an emitter layer that are disposed on a substrate to form a bipolar transistor; and an emitter electrode that is in ohmic contact with the emitter layer. The emitter layer has a shape that is long in one direction in plan view. An ohmic contact interface at which the emitter layer and the emitter electrode are in ohmic contact with each other has a planar shape in which at least one corner of a rectangle is chamfered.

According to still another aspect of the present disclosure, there is provided a semiconductor device including a collector layer, a base layer, and an emitter layer that are disposed on a substrate to form a bipolar transistor; an emitter electrode that is in ohmic contact with the emitter layer; and an emitter wiring line connected to the emitter electrode through a contact hole formed in an insulating film. The emitter layer has a shape that is long in one direction in plan view. The contact hole has a planar shape in which at least one corner of a rectangle is chamfered.

According to still another aspect of the present disclosure, there is provided a semiconductor device including a collector layer, a base layer, and an emitter layer that are disposed on a substrate to form a bipolar transistor; an emitter electrode that is in ohmic contact with the emitter layer; and an emitter wiring line connected to the emitter electrode through a contact hole formed in an insulating film. The emitter layer has a shape that is long in one direction. In at least one end portion of the emitter layer, an emitter access resistance which is an electrical resistance from a junction interface between the emitter layer and the base layer to the emitter electrode is 5 times or more the emitter access resistance in a central portion of the emitter layer.

The above-described arrangement of the emitter electrode, the shape of the emitter electrode, the arrangement of the contact hole for an emitter, and the shape of the contact hole for an emitter enable the transition voltage to be increased to extend the SOA.

Other features, elements, characteristics and advantages of the present disclosure will become more apparent from the following detailed description of preferred embodiments of the present disclosure with reference to the attached drawings.

BRIEF DESCRIPTION OF THE DRAWINGS

FIG. 14A is a plan view of an emitter layer, an emitter electrode, and an emitter wiring line of a semiconductor device according to a second embodiment;

FIG. 14B is a schematic sectional view taken along dash-dotted line 14B-14B in FIG. 14A;

FIG. 16 is a plan view of an emitter layer, an emitter electrode, an ohmic contact interface, a contact hole, and an emitter wiring line of a semiconductor device according to a third embodiment;

DETAILED DESCRIPTION

Prior to descriptions of embodiments, one factor that inhibits extension of the SOA in a typical HBT will be described with reference to FIGS. 1 to 3 on the basis of evaluation experiments conducted by the inventors of the present disclosure.

Figure 1:
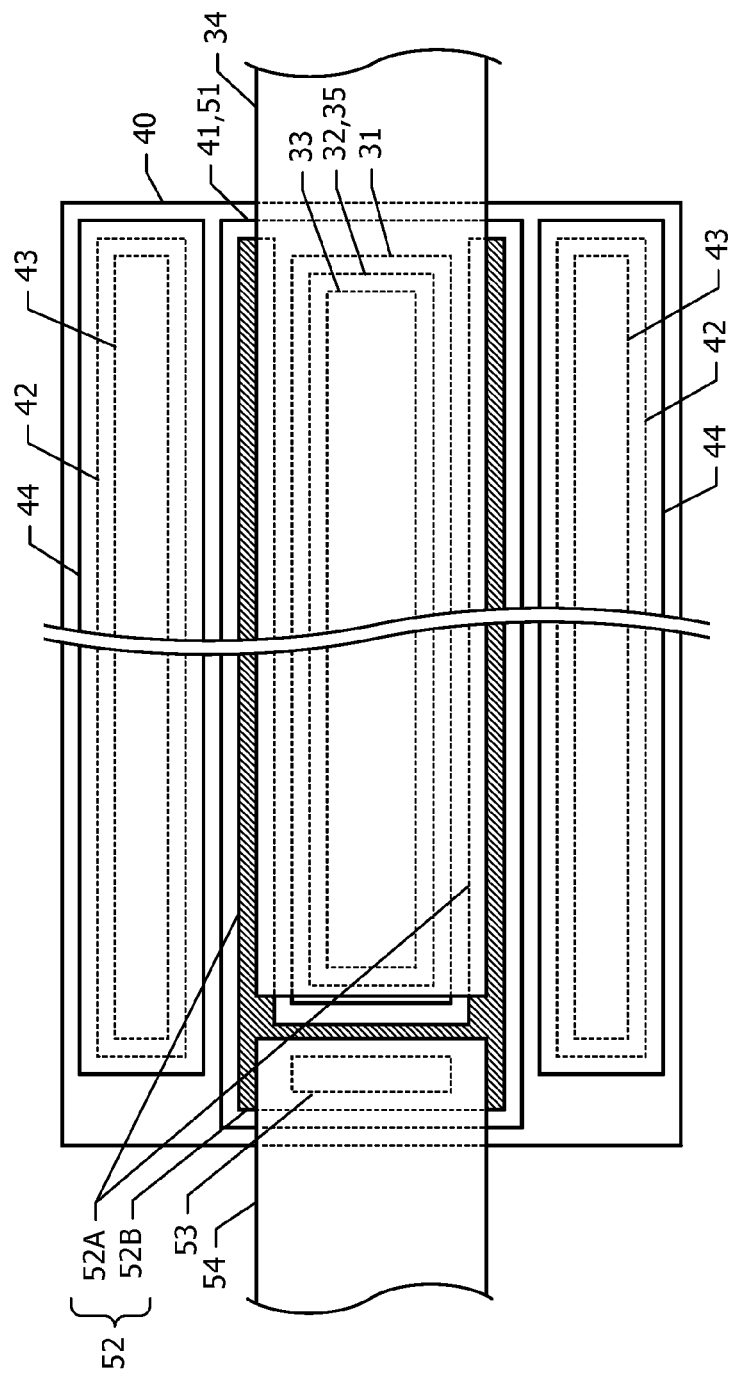
FIG. 1 is a plan view of an HBT according to a reference example for evaluation experiments.

FIG. 1 is a plan view of an HBT according to a reference example for evaluation experiments. A sub-collector layer 40 made of a semiconductor having conductivity is provided on a surface-layer portion of a substrate. A collector layer 41 and a base layer 51 are disposed on the sub-collector layer 40. The base layer 51 completely overlaps the collector layer 41 in plan view, and the collector layer 41 and the base layer 51 are arranged inside the sub-collector layer 40. An emitter layer 31 is disposed on the base layer 51. The emitter layer 31 is disposed inside the base layer 51 in plan view. The collector layer 41, the base layer 51, and the emitter layer 31 form a bipolar transistor, for example, an HBT.

The emitter layer 31 has a planar shape that is long in one direction (the lateral direction in FIG. 1) in plan view. The planar shape of the emitter layer 31 is, for example, a rectangle. An emitter electrode 32 is disposed on the emitter layer 31. The emitter electrode 32 is formed of a metal and is in ohmic contact with the emitter layer 31. The interface at which the emitter electrode 32 and the emitter layer 31 are in ohmic contact with each other is referred to as an "ohmic contact interface". An ohmic contact interface 35 completely overlaps the emitter electrode 32 in plan view. The edge of the ohmic contact interface 35 is disposed slightly inside the edge of the emitter layer 31 so as to maintain a substantially uniform gap between the edge of the ohmic contact interface 35 and the edge of the emitter layer 31.

A base electrode 52 is disposed on the base layer 51 and is in ohmic contact with the base layer 51. In FIG. 1, the base electrode 52 is indicated by hatching. The base electrode 52 includes two base electrode main portions 52A and a base electrode pad portion 52B. The two base electrode main portions 52A are disposed on both sides of the emitter layer 31 in a width direction and extend in a longitudinal direction of the emitter layer 31 in plan view. The base electrode pad portion 52B connects the two base electrode main portions 52A to each other outside one end portion (on the left end in FIG. 1) of the emitter layer 31 in the longitudinal direction. The base electrode 52 including the base electrode main portions 52A and the base electrode pad portion 52B surrounds the emitter layer 31 so as to form a U-shape.

Collector electrodes 42 are disposed inside the sub-collector layer 40 and on both sides of the collector layer 41. The collector electrodes 42 each have a planar shape that is long in a direction parallel to the longitudinal direction of the emitter layer 31. The collector electrodes 42 are connected to the collector layer 41 through the sub-collector layer 40.

An insulating film is disposed on the emitter electrode 32, the collector electrodes 42, and the base electrode 52. An emitter wiring line 34, collector wiring lines 44, and a base wiring line 54 are disposed on the insulating film so as to overlap the emitter electrode 32, the collector electrodes 42, and the base electrode pad portion 52B, respectively, in plan view. The emitter wiring line 34 is connected to the emitter electrode 32 through a contact hole 33 formed in the insulating film. The collector wiring lines 44 are connected to the collector electrodes 42 through contact holes 43 formed in the insulating film. The base wiring line 54 is connected to the base electrode pad portion 52B through a contact hole 53 formed in the insulating film.

The contact hole 33 for an emitter is disposed inside the emitter electrode 32 in plan view and has a planar shape that is long in the longitudinal direction of the emitter layer 31. The contact holes 43 for collectors are disposed inside the collector electrodes 42 in plan view and each have a planar shape that is long in the longitudinal direction of the collector electrodes 42. The contact hole 53 for a base is formed at an intersection of the base electrode pad portion 52B and an extension of the emitter layer 31 extending in the longitudinal direction.

The emitter wiring line 34 extends, in a direction parallel to the longitudinal direction of the emitter layer 31, from the position at which the contact hole 33 is disposed. The base wiring line 54 extends, in a direction opposite to the direction in which the emitter wiring line 34 extends, from the position at which the contact hole 53 is disposed. Second-layer wiring lines may be disposed on the emitter wiring line 34, the collector wiring lines 44, and the base wiring line 54.

The emitter layer 31, the emitter electrode 32, and the contact hole 33 are arranged symmetrically with respect to both the longitudinal direction and the width direction in plan view. The gap between the edge of the emitter layer 31 and the edge of the emitter electrode 32 is substantially uniform regardless of the longitudinal direction and the width direction. The gap between the edge of the emitter layer 31 and the edge of the contact hole 33 is also substantially uniform regardless of the longitudinal direction and the width direction. Herein, the term "substantially uniform" means that the variation in a dimension is within the range of the variation in terms of process, for example, the range of the variation is 0.5 μm or less.

In general, the area of the emitter electrode 32 is designed as large as possible in order to ensure a large region in the emitter layer 31 where a current flows. For example, the gap between the outer peripheral line of the emitter layer 31 and the outer peripheral line of the emitter electrode 32 is designed to be 1 μm or less.

When the HBT illustrated in FIG. 1 forms a monolithic microwave integrated circuit (MMIC) element in which power amplifiers are incorporated, a plurality of HBTs are disposed on a single semiconductor substrate. The plurality of HBTs are electrically connected together through the emitter wiring line 34, the collector wiring lines 44, the base wiring line 54, the second-layer wiring lines, etc. either directly or indirectly with an element such as a resistor therebetween. Thus, a power-stage or driver-stage power amplifier is formed.

Figure 2:
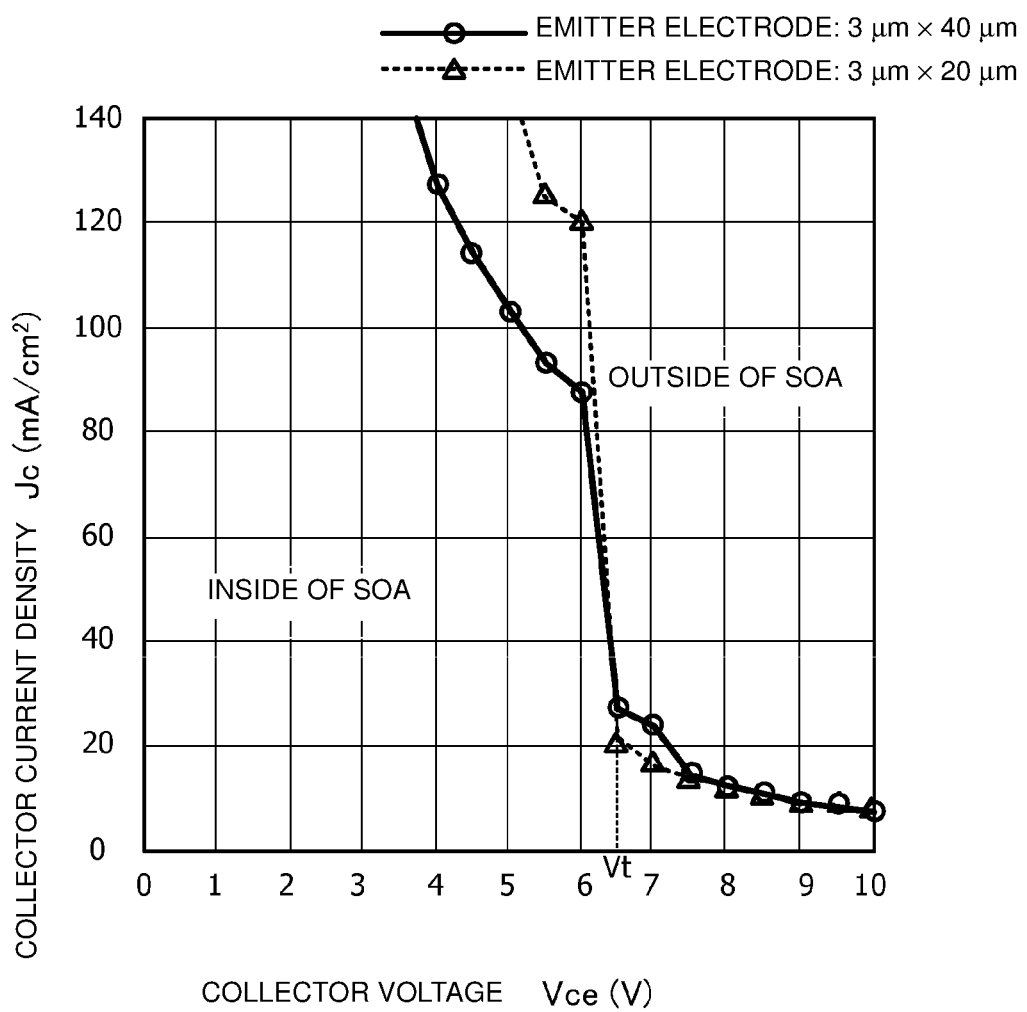
FIG. 2 is a graph showing actual measurement results of SOA lines of HBTs.

FIG. 2 is a graph showing actual measurement results of SOA lines of HBTs. The horizontal axis represents a collector voltage Vce in units of "V", and the vertical axis represents a collector current density Jc in units of "mA/cm$^2$". The circles and the triangles in the graph show SOA lines based on actual measurement of samples having different emitter dimensions. The circles and the solid line in the graph in FIG. 2 represent actual measurement results of a sample that includes an emitter electrode 32 having a width of 3 μm and a length of 40 μm. The triangles and the dashed line in the graph represent actual measurement results of a sample that includes an emitter electrode 32 having a width of 3 μm and a length of 20 μm. A region on the low-voltage side of each of the SOA lines corresponds to the SOA.

The graph shows that when the collector voltage Vce increases from 6 V to 6.5 V, each of the SOA lines rapidly discontinuously decreases. The collector voltage Vce at which the SOA line discontinuously decreases corresponds to a transition voltage Vt.

In the reference example illustrated in FIGS. 1 and 2, the number of the emitter electrodes 32 is one, and the number of the base electrode main portions 52A is two. In HBTs having other combinations of the number of the emitter electrodes 32 and the number of the base electrode main portions 52A, the discontinuous decrease is similarly confirmed in the SOA lines. The discontinuous decrease in the SOA lines is also confirmed in, for example, an HBT including one emitter electrode 32 and one base electrode main portion 52A, an HBT including two emitter electrodes 32 and one base electrode main portion 52A, an HBT including two emitter electrodes 32 and three base electrode main portions 52A, and an HBT including three emitter electrodes 32 and four base electrode main portions 52A.

Figure 3:
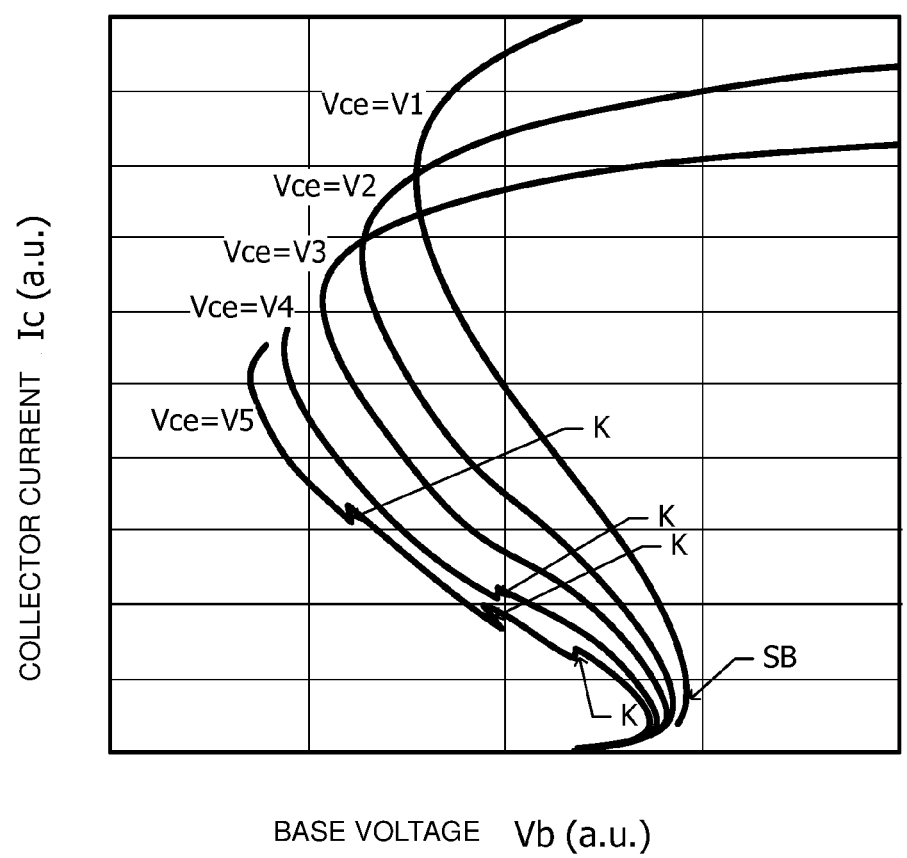
FIG. 3 is a graph showing actual measurement results of collector current-base voltage characteristics (Ic-Vb characteristics)

FIG. 3 is a graph showing actual measurement results of collector current-base voltage characteristics (Ic-Vb characteristics). The horizontal axis represents a base voltage Vb in arbitrary units, and the vertical axis represents a collector current Ic in arbitrary units. In the measurement, the base voltage Vb and the collector current Ic were measured while sweeping a base current Ib with a current source. The measurement was conducted at a plurality of voltages of collector voltage Vce=V1, V2, V3, V4, and V5. Here, the voltage V1 to the voltage V5 have a magnitude relationship of V1<V2<V3<V4<V5.

In a range where the collector current Ic is small, the collector current Ic monotonically increases with an increase in the base voltage Vb, and the slope of the collector current Ic with respect to the base voltage Vb gradually increases. When the collector current Ic is further increased, a snapback point SB at which the slope of the collector current Ic with respect to the base voltage Vb is infinite appears. When the collector current Ic is further increased beyond the snapback point SB, the slope of the collector current Ic with respect to the base voltage Vb changes to negative, and the base voltage Vb decreases with an increase in the collector current Ic.

When the collector voltage Vce is V4 and V5, a kink K at which the collector current Ic discontinuously decreases appears after the collector current Ic passes through the snapback point SB. When the collector voltage Vce is V1, V2, and V3, which is lower than V4 and V5, the kink K does not appear. The minimum collector voltage Vce at which the kink K appears corresponds to the transition voltage Vt (FIG. 2). Herein, the term "kink K" refers to a characteristic region where a temporary increase in the base voltage Vb or a temporary decrease in the collector current Ic appears in a region where the base voltage Vb decreases and the collector current Ic increases in the Ic-Vb characteristics (refer to FIG. 3).

Next, a description will be made of a reason why the kink K appears in a region beyond the snapback point SB in the collector current-base voltage characteristics.

The appearance of the kink K is considered to be due to a thermal or electrical asymmetry of the HBT. In the inside of the emitter layer 31 (FIG. 1), the arrangement of the emitter electrode 32 and the contact hole 33 maintains symmetry. However, the collector electrodes 42, the base electrode 52, various wiring lines, and the like, which are asymmetrically arranged with respect to the emitter layer 31, are disposed on the periphery of the emitter layer 31. In addition, when the arrangement of a plurality of HBTs and lead wiring lines, circuit elements, via-holes, and the like on the periphery of the HBTs, all of which form a power-stage or driver-stage power amplifier, is viewed from above, thermal and electrical asymmetry factors are present for one emitter layer 31 that is focused on.

When the collector current increases beyond the snapback point SB, a region where the emitter current Ie mainly flows is shifted by the asymmetry factors in the longitudinal direction of the emitter layer 31 (FIG. 1). The kink K (FIG. 3) is considered to appear as a result of the shift of the region where the emitter current Ie mainly flows. In embodiments described below, the position of the region where the emitter current Ie mainly flows is unlikely to be affected by asymmetry factors on the periphery of the emitter layer 31.

First Embodiment

A semiconductor device according to a first embodiment will be described with reference to FIGS. 4 to 8B.

Figure 4:
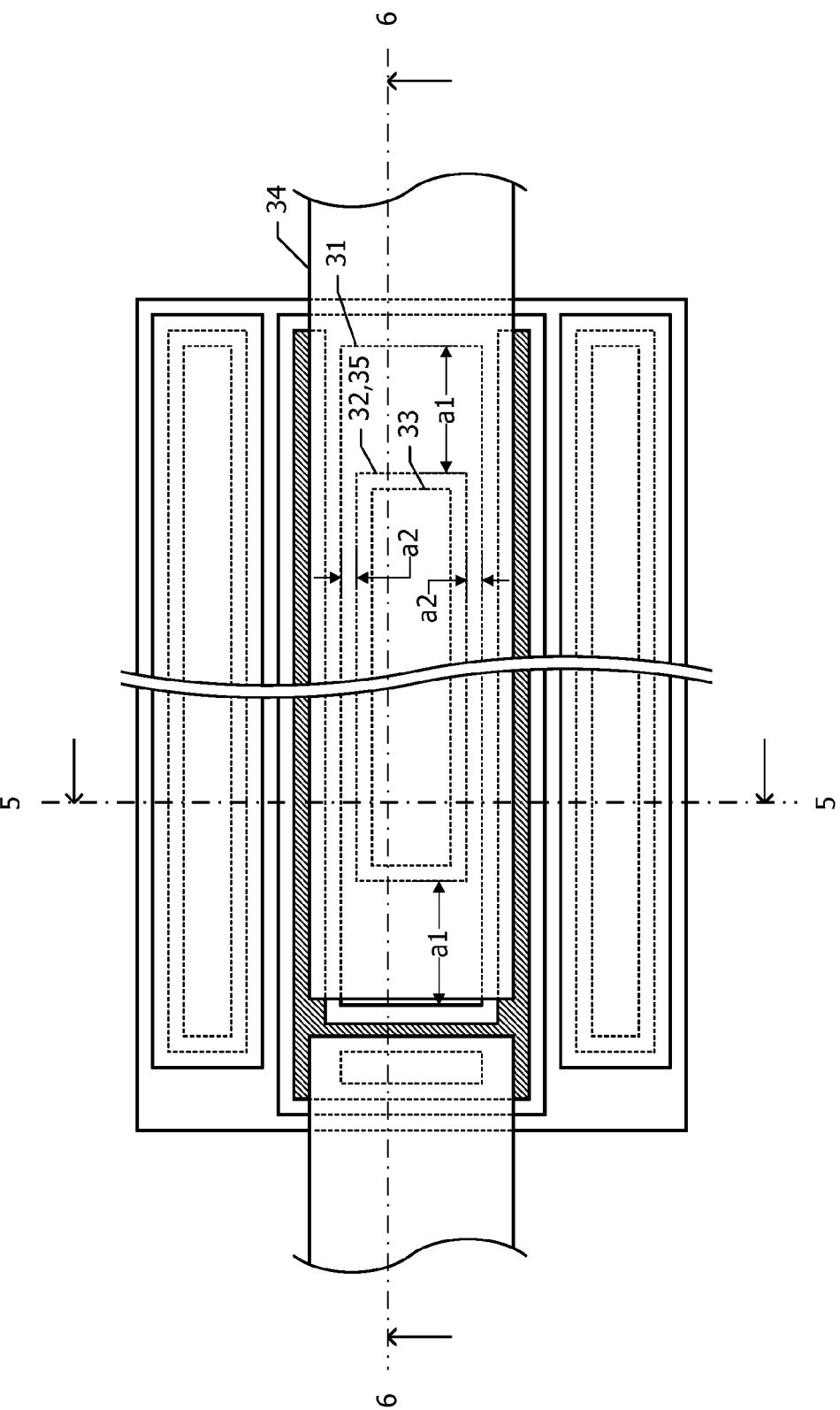
FIG. 4 is a plan view of a semiconductor device according to a first embodiment.

FIG. 4 is a plan view of a semiconductor device according to the first embodiment. Hereinafter, the difference from the plan view (FIG. 1) of the semiconductor device according to the reference example will be described, and descriptions of common configurations will be omitted.

In the reference example (FIG. 1), the gap between the edge of the emitter layer 31 and the edge of the emitter electrode 32 (ohmic contact interface 35) is uniform regardless of the longitudinal direction and the width direction. Herein, a gap (distance) from an edge of an emitter layer 31, the edge being located at an end portion in the longitudinal direction of the emitter layer 31, to an edge of an ohmic contact interface 35, the edge being located at an end portion in the longitudinal direction of the ohmic contact interface 35, is referred to as a distance a1 with respect to the longitudinal direction. A gap (distance) from an edge of the emitter layer 31, the edge being parallel to the longitudinal direction of the emitter layer 31, to an edge of the ohmic contact interface 35, the edge being parallel to the longitudinal direction of the ohmic contact interface 35, is referred to as a distance a2 with respect to the width direction. The distance a2 with respect to the width direction of the emitter layer 31 is substantially uniform regardless of the position, and the distance a1 with respect to the longitudinal direction is also substantially uniform regardless of the position. In reality, corners of the rectangles of the emitter layer 31 and the ohmic contact interface 35 may be rounded in the production process. In such a case, a longitudinal direction component of a distance from a leading end of the emitter layer 31 in the longitudinal direction to a leading end of the ohmic contact interface 35 in the longitudinal direction is defined as the distance a1 with respect to the longitudinal direction.

The dimension of the emitter layer 31 in the longitudinal direction is, for example, 5 μm or more and 60 μm or less (i.e., from 5 μm to 60 μm). The dimension of the emitter layer 31 in the width direction is, for example, 1 μm or more and 8 μm or less (i.e., from 1 μm to 8 μm).

In the first embodiment, the distance a1 with respect to the longitudinal direction of the emitter layer 31 is longer than the distance a2 with respect to the width direction of the emitter layer 31. As a result, the difference in dimension with respect to the longitudinal direction between the emitter layer 31 and the ohmic contact interface 35 (double the distance a1 with respect to the longitudinal direction) is larger than the difference in dimension with respect to the width direction between the emitter layer 31 and the ohmic contact interface 35 (double the distance a2 with respect to the width direction).

Figure 5:
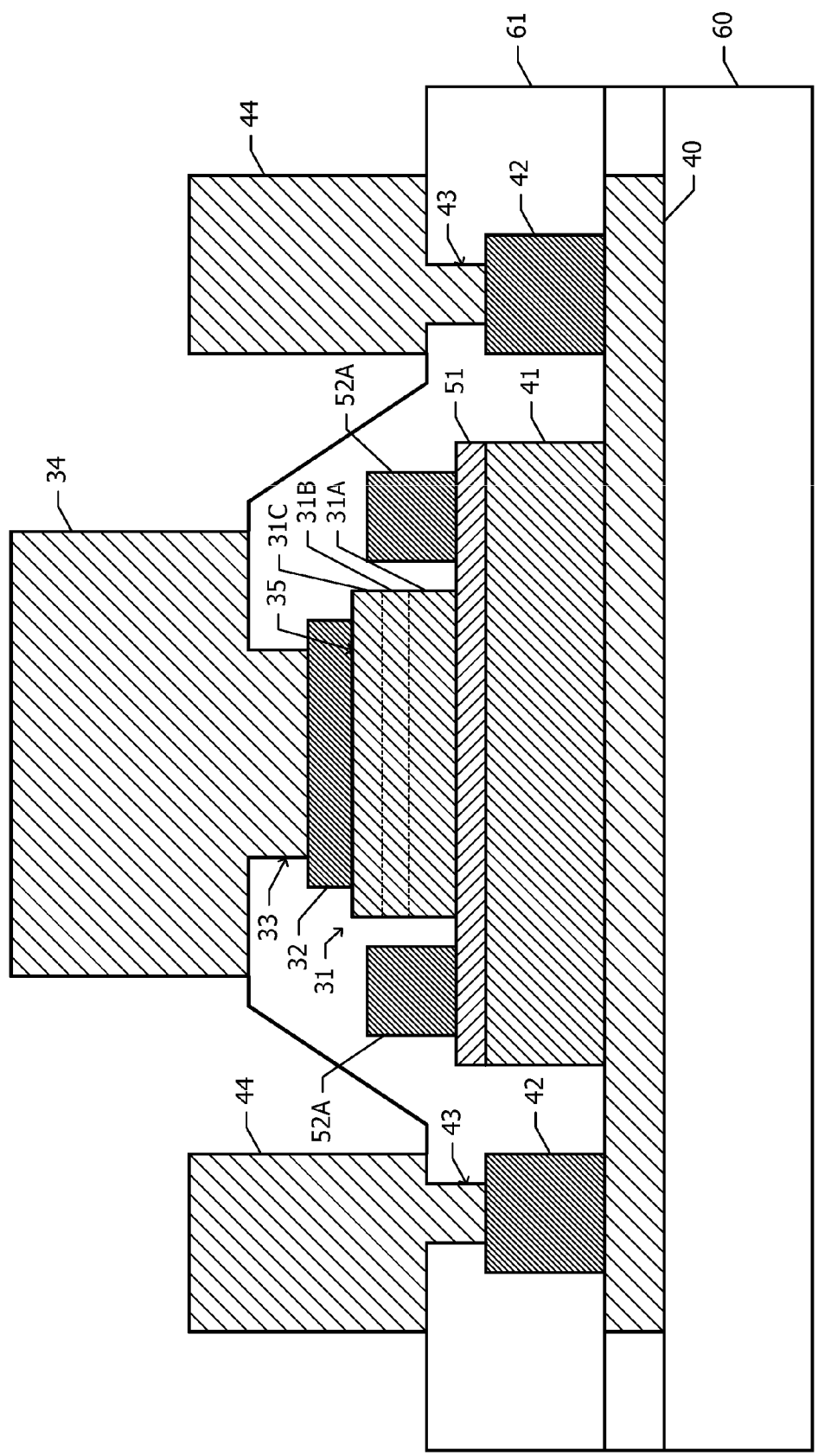
FIG. 5 is a sectional view taken along dash-dotted line 5-5 in FIG. 4.

FIG. 5 is a sectional view taken along dash-dotted line 5-5 in FIG. 4. A sub-collector layer 40 is disposed on a substrate 60 made of a semi-insulating semiconductor. A collector layer 41 is disposed on a partial region of the sub-collector layer 40, and a base layer 51 is disposed on the collector layer 41. Edges of the base layer 51 coincide with edges of the collector layer 41. An emitter layer 31 is disposed on a partial region of the base layer 51. The emitter layer 31 includes, for example, three layers, namely, a narrow-sense emitter layer 31A, a cap layer 31B, and a contact layer 31C. The collector layer 41, the base layer 51, and the emitter layer 31 form an HBT.

Collector electrodes 42 are disposed in regions on both sides of the collector layer 41 on the upper surface of the sub-collector layer 40. The collector electrodes 42 are connected to the collector layer 41 through the sub-collector layer 40. Base electrode main portions 52A are disposed in regions on both sides of the emitter layer 31 on the upper surface of the base layer 51. The base electrode main portions 52A are in ohmic contact with the base layer 51. An emitter electrode 32 is disposed in a partial region on the upper surface of the emitter layer 31. The interface between the emitter electrode 32 and the emitter layer 31 corresponds to an ohmic contact interface 35.

An insulating film 61 is disposed so as to cover the collector electrodes 42, the base electrode main portions 52A, and the emitter electrode 32. Collector wiring lines 44 and an emitter wiring line 34 are disposed on the insulating film 61. The collector wiring lines 44 are connected to the collector electrodes 42 through contact holes 43 formed in the insulating film 61. The emitter wiring line 34 is connected to the emitter electrode 32 through a contact hole 33 formed in the insulating film 61.

Figure 6:
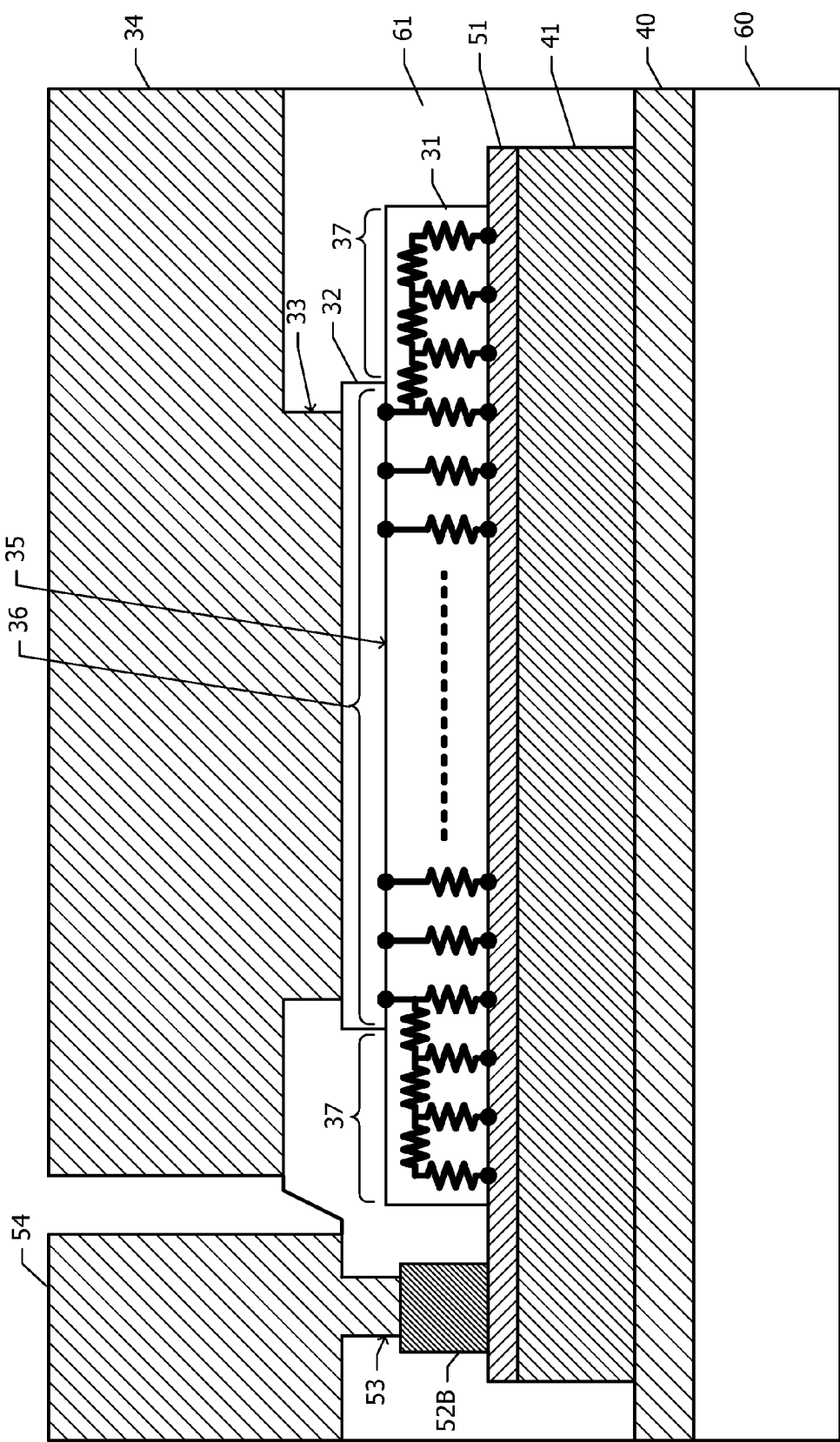
FIG. 6 is a sectional view taken along dash-dotted line 6-6 in FIG. 4.

FIG. 6 is a sectional view taken along dash-dotted line 6-6 in FIG. 4. A sub-collector layer 40, a collector layer 41, a base layer 51, an emitter layer 31, and an emitter electrode 32 are stacked on a substrate 60 in this order. A base electrode pad portion 52B is disposed in a partial region on the upper surface of the base layer 51. An insulating film 61 covers the emitter layer 31, the emitter electrode 32, and the base electrode pad portion 52B. An emitter wiring line 34 and a base wiring line 54 are disposed on the insulating film 61. The emitter wiring line 34 is connected to the emitter electrode 32 through a contact hole 33 formed in the insulating film 61. The base wiring line 54 is connected to the base electrode pad portion 52B through a contact hole 53 formed in the insulating film 61. The emitter electrode 32 can be approximately assumed to be equipotential because the emitter electrode 32 is formed of a low-resistance material such as a metal having electrical conductivity sufficiently higher than that of the emitter layer 31 formed of a semiconductor. In FIG. 6, the emitter electrode 32 is assumed to be equipotential, and only the resistance from the emitter electrode 32 to an emitter-base junction interface is schematically illustrated.

The emitter layer 31 is divided into a region right under an ohmic contact interface 35 (hereinafter referred to as a "central region 36") and regions outside the ohmic contact interface 35 (hereinafter referred to as "end regions 37"). In the central region 36, an emitter current flows in the emitter layer 31 mainly in the thickness direction between the emitter electrode 32 and the base layer 51. In contrast, in the end regions 37, an emitter current flows in the emitter layer 31 from the base layer 51 not only in the thickness direction but also in the in-plane direction and reaches the emitter electrode 32 because the emitter electrode 32 does not overlap the emitter layer 31. Therefore, an emitter access resistance in the end regions 37 is increased by the amount of resistance corresponding to the sheet resistance of the emitter layer 31 as compared with the central region 36. Herein, the term "emitter access resistance" means an electrical resistance of a current path from the interface between the emitter layer 31 and the base layer 51 to the interface between the emitter wiring line 34 and the emitter electrode 32.

In one example, the narrow-sense emitter layer 31A (FIG. 5) is formed of n-type InGaP having a Si doping concentration of $2 \times 10^{17}$ cm$^{-3}$ or more and $5 \times 10^{17}$ cm$^{-3}$ or less (i.e., from $2 \times 10^{17}$ cm$^{-3}$ to $5 \times 10^{17}$ cm$^{-3}$) and has a thickness of 20 nm or more and 50 nm or less (i.e., from 20 nm to 50 nm). The cap layer 31B (FIG. 5) is formed of n-type GaAs having a Si doping concentration of $2 \times 10^{18}$ cm$^{-3}$ or more and $4 \times 10^{18}$ cm$^{-3}$ or less (i.e., from $2 \times 10^{18}$ cm$^{-3}$ to $4 \times 10^{18}$ cm$^{-3}$) and has a thickness of 50 nm or more and 200 nm or less (i.e., from 50 nm to 200 nm). The contact layer 31C (FIG. 5) is formed of n-type InGaAs having a Si doping concentration of $1 \times 10^{19}$ cm$^{-3}$ or more and $3 \times 10^{19}$ cm$^{-3}$ or less (i.e., from $1 \times 10^{19}$ cm$^{-3}$ to $3 \times 10^{19}$ cm$^{-3}$) and has a thickness of 100 nm or more and 200 nm or less (i.e., from 100 nm to 200 nm). Accordingly, the increase in the emitter access resistance is mainly due to the sheet resistance of the cap layer 31B and the contact layer 31C. For example, the total sheet resistance of the emitter layer 31 including the three layers is 20 Ω/sq. or more and 50 Ω/sq. or less (i.e., from 20 Ω/sq. to 50 Ω/sq.).

Next, advantageous effects of the first embodiment will be described with reference to FIG. 7.

Figure 7:
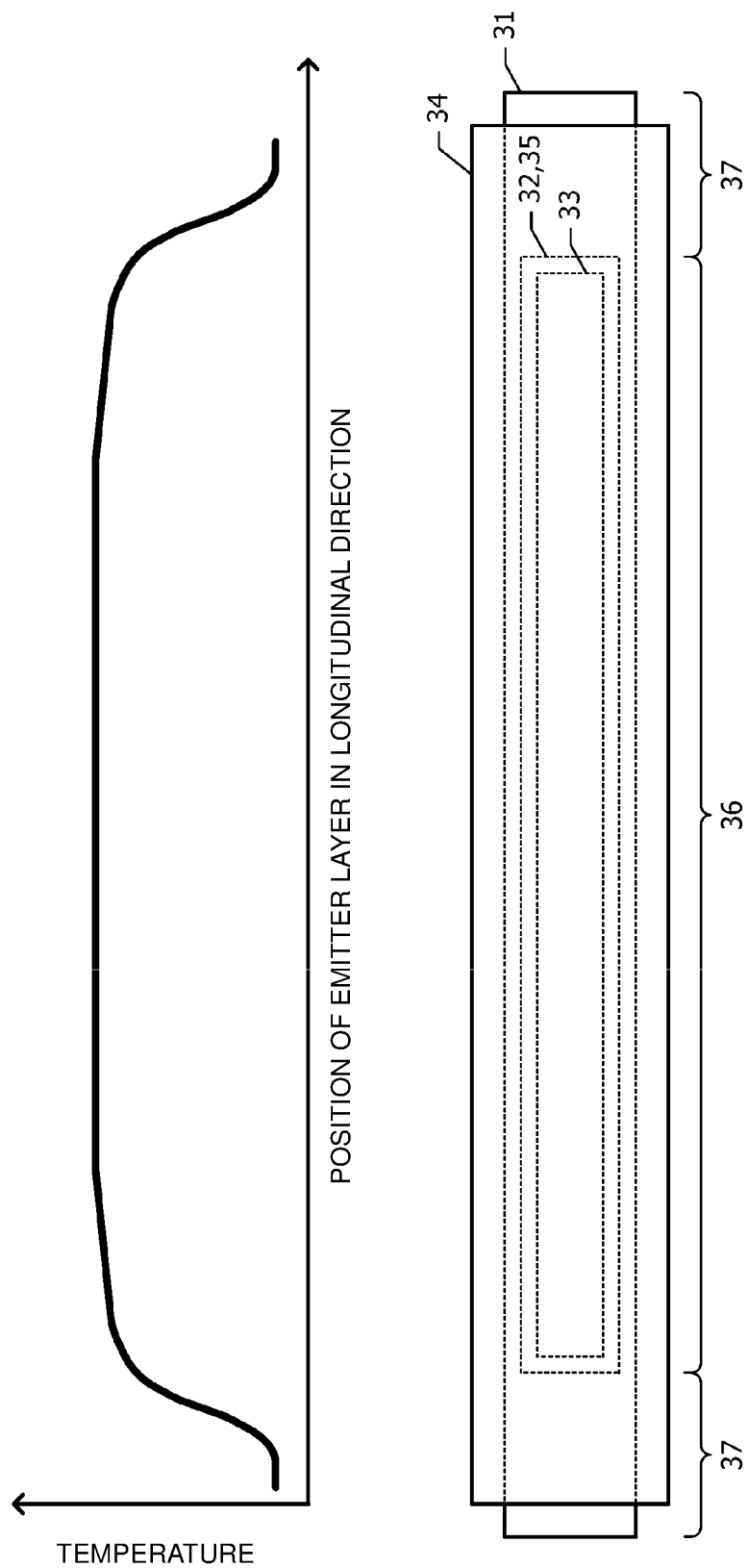
FIG. 7 includes a plan view near an emitter layer of a semiconductor device according to the first embodiment and a graph showing an example of a temperature distribution with respect to a longitudinal direction of the emitter layer during operation.

FIG. 7 includes a plan view near an emitter layer 31 of a semiconductor device according to the first embodiment and a graph showing an example of a temperature distribution with respect to the longitudinal direction of the emitter layer 31 during operation. The horizontal axis of the graph showing the temperature distribution represents a position of the emitter layer 31 in the longitudinal direction, and the vertical axis of the graph represents a temperature.

In the end regions 37, when the emitter current increases and exceeds the snapback point SB (FIG. 3), a voltage drop becomes larger than that in the central region 36 due to the emitter access resistance. As a result, the net base-emitter voltage excluding the effect of the parasitic resistance decreases, and an emitter current flowing in the end regions 37 is suppressed. Specifically, in the end regions 37, the density of a current flowing through the emitter-base junction interface is decreased compared with the central region 36. The decrease in the current density relatively decreases the temperature of each of the end regions 37 compared with the temperature of the central region 36.

The relative decrease in the temperature of each of the end regions 37 causes a further relative decrease in the current density. Due to this chain of feedback, in the collector current-base voltage characteristics (Ic-Vb characteristics) shown in FIG. 3, a current flowing in the end regions 37 rapidly decreases in the high-current range after passing of the snapback point SB compared with that in the low-current range before passing of the snapback point SB. As a result, the current does not substantially flow in the end regions 37. A region where the emitter current flows mainly and a region having a high temperature are substantially limited to the central region 36.

Since the region where the emitter current flows mainly and the region having a high temperature are limited to the central region 36 of the emitter layer 31, the emitter current is unlikely to be affected by the thermal and electrical asymmetries near the end portions of the emitter layer 31. Accordingly, the appearance of the kink K (FIG. 3) is suppressed to achieve the effect of increasing the transition voltage Vt (FIG. 2). As a result, the range of the SOA is extended, and the operation at a high collector voltage can be realized.

Next, a preferred distribution of the emitter access resistance will be described. In order to extend the range of the SOA, the emitter access resistance in at least one end portion of the emitter layer is preferably larger than the emitter access resistance in a central portion of the emitter layer. In order to obtain a sufficient effect of extending the range of the SOA, the emitter access resistance in at least one end portion of the emitter layer is preferably 5 times or more the emitter access resistance in the central portion of the emitter layer. Although it is difficult to actually measure the emitter access resistance of an HBT, the emitter access resistance can be determined by, for example, performing a numerical simulation.

Next, a preferred dimension of the distance a1 with respect to the longitudinal direction of the emitter layer 31 for extending the range of the SOA will be described with reference to FIGS. 8A and 8B. An increase in the transition voltage Vt (FIG. 2), which is a collector voltage Vce at which the SOA line discontinuously decreases, means an extension of the range of the SOA. Therefore, a preferred dimension of the distance a1 with respect to the longitudinal direction was determined by evaluating the transition voltage Vt.

Figure 8A:
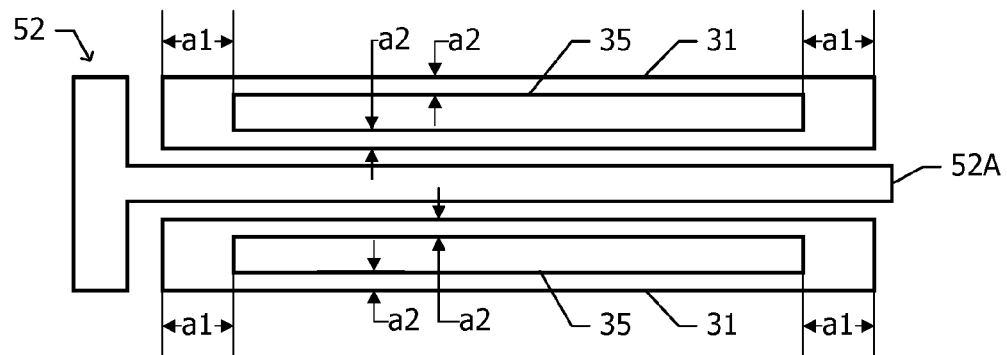
FIG. 8A is a plan view of emitter layers, ohmic contact interfaces, and a base electrode of an HBT prepared for evaluating a transition voltage Vt.

FIG. 8A is a plan view of emitter layers 31, ohmic contact interfaces 35, and a base electrode 52 of an HBT prepared for evaluating the transition voltage Vt. A plurality of HBTs having different distances a1 with respect to the longitudinal direction of the emitter layer 31 were actually prepared, and the transition voltage Vt was measured. The samples prepared above are so-called double-emitter HBTs in which emitter layers 31 are disposed on both sides of a base electrode main portion 52A. Each of the emitter layers 31 has a length of 40 μm and a width of 3 μm. The distance a1 with respect to the longitudinal direction in one end portion of the emitter layer 31 is equal to the distance a1 with respect to the longitudinal direction in the other end portion of the emitter layer 31. The distance a2 with respect to the width direction is 0.3 μm.

Figure 8B:
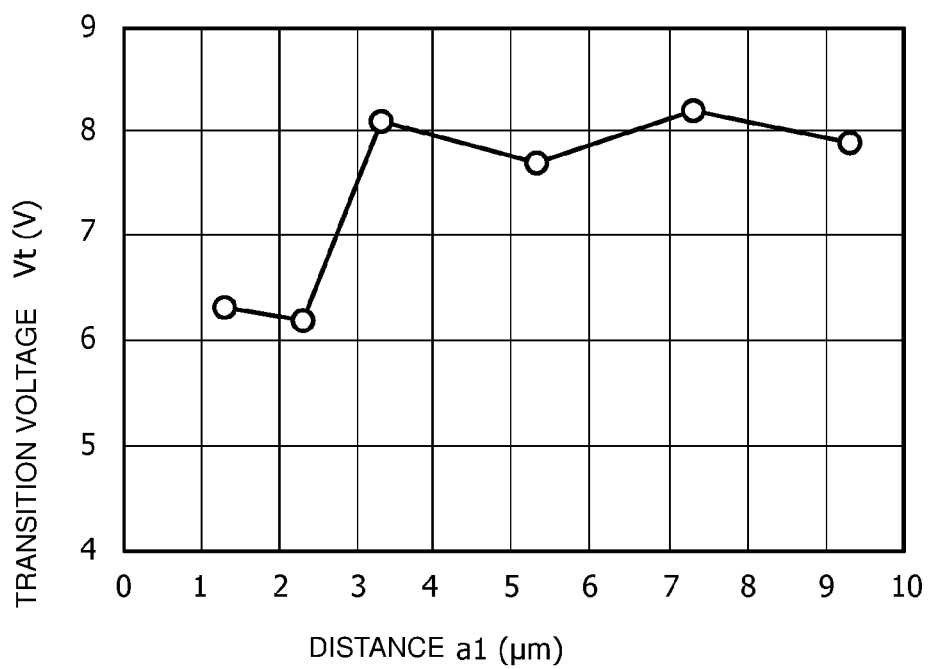
FIG. 8B is a graph showing measurement results of a transition voltage Vt.

FIG. 8B is a graph showing measurement results of the transition voltage Vt. The horizontal axis represents the distance a1 with respect to the longitudinal direction of the emitter layer 31 in units of "μm", and the vertical axis represents the transition voltage Vt in units of "V". In a range where the distance a1 with respect to the longitudinal direction is 2.2 μm or less, the transition voltage Vt is about 6.3 V. In a range where the distance a1 with respect to the longitudinal direction is 3 μm or more, the transition voltage Vt increases to about 8 V. For example, when the distance a1 with respect to the longitudinal direction is increased from 2.2 μm to 3.2 μm, the transition voltage Vt increases by about 1.9 V.

The results of the evaluation experiment in FIG. 8B show that a significant effect of increasing the transition voltage Vt is obtained when the distance a1 with respect to the longitudinal direction is 3 μm or more. This effect is generated by increasing the emitter access resistance from the emitter electrode 32 to the emitter-base junction interface in an end region 37, as described with reference to FIG. 7.

In order to obtain the effect of increasing the transition voltage Vt, the distance a1 with respect to the longitudinal direction is not necessarily increased in both end portions of the emitter layer 31. A certain effect of increasing the transition voltage Vt is obtained as long as the distance a1 with respect to the longitudinal direction is increased in at least one end portion of the emitter layer 31. For example, the difference in dimension with respect to the longitudinal direction between the emitter layer 31 and the ohmic contact interface 35 (double the distance a1 with respect to the longitudinal direction) is preferably larger than the difference in dimension with respect to the width direction between the emitter layer 31 and the ohmic contact interface 35 (double the distance a2 with respect to the width direction). In particular, the difference in dimension with respect to the longitudinal direction between the emitter layer 31 and the ohmic contact interface 35 is preferably 10 times or more the difference in dimension with respect to the width direction between the emitter layer 31 and the ohmic contact interface 35. When one end portion of the emitter layer 31 is focused on, the distance a1 with respect to the longitudinal direction is preferably 5 times or more the difference in dimension with respect to the width direction between the emitter layer 31 and the ohmic contact interface 35 in at least one end portion.

In order to confirm the extension of the SOA, a sample corresponding to the HBT according to the first embodiment (FIG. 4) and a sample corresponding to the HBT according to the reference example (FIG. 1) were prepared, and an evaluation experiment for measuring the SOA line was conducted. The result of this evaluation experiment will now be described with reference to FIG. 9.

Figure 9:
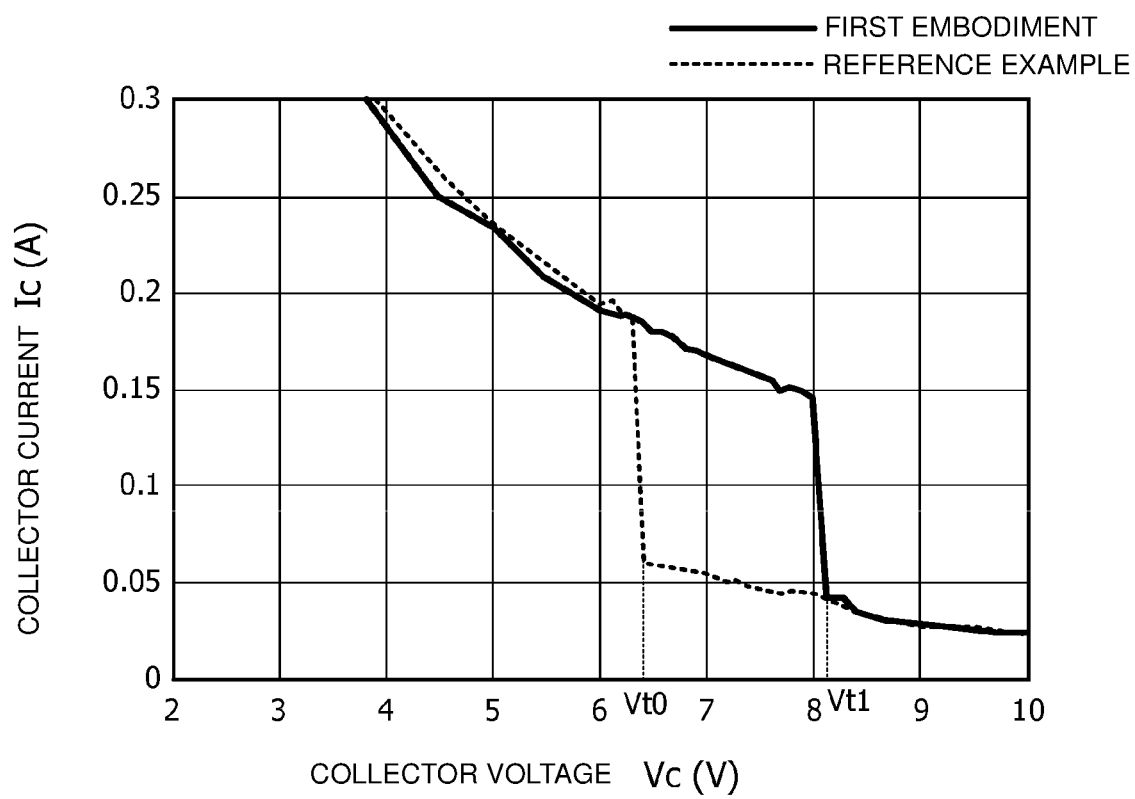
FIG. 9 is a graph showing measurement results of SOA lines of a sample corresponding to an HBT according to the first embodiment (FIG. 4) and a sample corresponding to an HBT according to the reference example (FIG. 1)

FIG. 9 is a graph showing measurement results of the SOA lines of the sample corresponding to the HBT according to the first embodiment (FIG. 4) and the sample corresponding to the HBT according to the reference example (FIG. 1). The samples prepared above each have the double-emitter structure illustrated in FIG. 8A. In the sample corresponding to the HBT according to the first embodiment (FIG. 4), the positional relationship between an emitter layer 31 and an emitter electrode 32 is the same as that of the HBT according to the first embodiment. In the sample corresponding to the HBT according to the reference example (FIG. 1), the positional relationship between an emitter layer 31 and an emitter electrode 32 is the same as that of the HBT according to the reference example. The horizontal axis of the graph shown in FIG. 9 represents a collector voltage Vc in units of "V", and the vertical axis of the graph represents a collector current Ic in units of "A". The solid line and the dashed line in the graph in FIG. 9 represent the measurement results of the SOA lines of the sample corresponding to the HBT according to the first embodiment and the sample corresponding to the HBT according to the reference example, respectively.

The graph shows that a transition voltage Vt1 of the sample corresponding to the HBT according to the first embodiment is higher than a transition voltage Vt0 of the sample corresponding to the HBT according to the reference example. This evaluation experiment shows that the range of the SOA is extended by using the structure of the HBT according to the first embodiment.

Next, a relative preferred positional relationship between an emitter layer 31 and an emitter wiring line 34 will be described with reference to FIGS. 10A to 11.

Figure 10A:
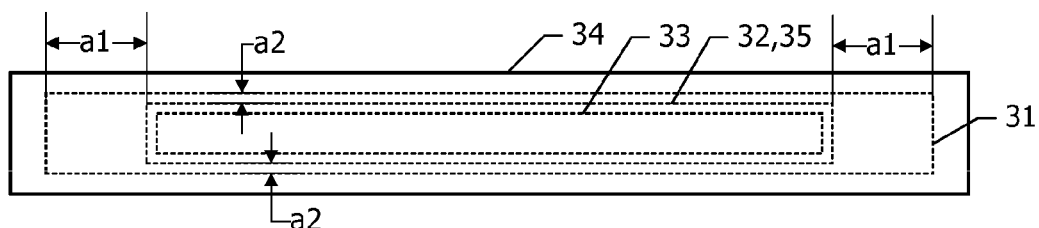
FIGS. 10A, 10B, and 10C are plan views each illustrating a positional relationship of an emitter layer, an emitter electrode, an ohmic contact interface, a contact hole, and an emitter wiring line.
Figure 10B:
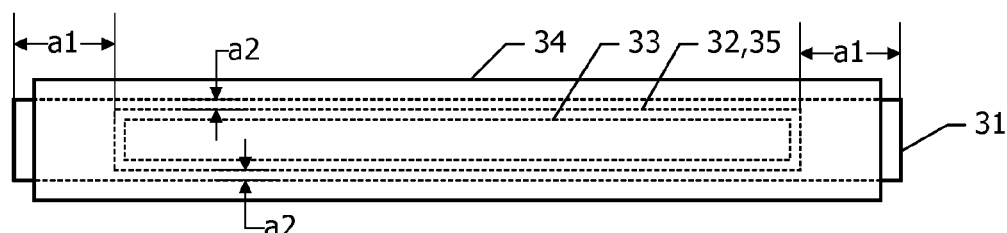
Figure 10C:
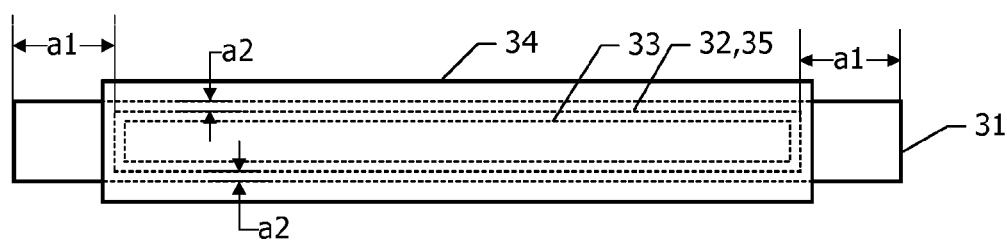

FIGS. 10A, 10B, and 10C are plan views each illustrating a positional relationship of an emitter layer 31, an emitter electrode 32, an ohmic contact interface 35, a contact hole 33, and an emitter wiring line 34. In each of the examples illustrated in FIGS. 10A, 10B, and 10C, the distance a1 with respect to the longitudinal direction of the emitter layer 31 is longer than the distance a2 with respect to the width direction of the emitter layer 31.

In the example illustrated in FIG. 10A, each of end portions of the emitter wiring line 34 is disposed outside the corresponding end portion of the emitter layer 31 with respect to the longitudinal direction of the emitter layer 31. In the examples illustrated in FIGS. 10B and 10C, each of end portions of the emitter wiring line 34 is disposed between the corresponding end portion of the emitter layer 31 and the corresponding end portion of the ohmic contact interface 35 with respect to the longitudinal direction of the emitter layer 31. In the example illustrated in FIG. 10B, the end portion of the emitter wiring line 34 is disposed outside the center between the end portion of the emitter layer 31 and the end portion of the ohmic contact interface 35 (on the side closer to the end portion of the emitter layer 31). In contrast, in the example illustrated in FIG. 10C, the end portion of the emitter wiring line 34 is disposed inside the center between the end portion of the emitter layer 31 and the end portion of the ohmic contact interface 35 (on the side closer to the end portion of the ohmic contact interface 35).

Figure 11:
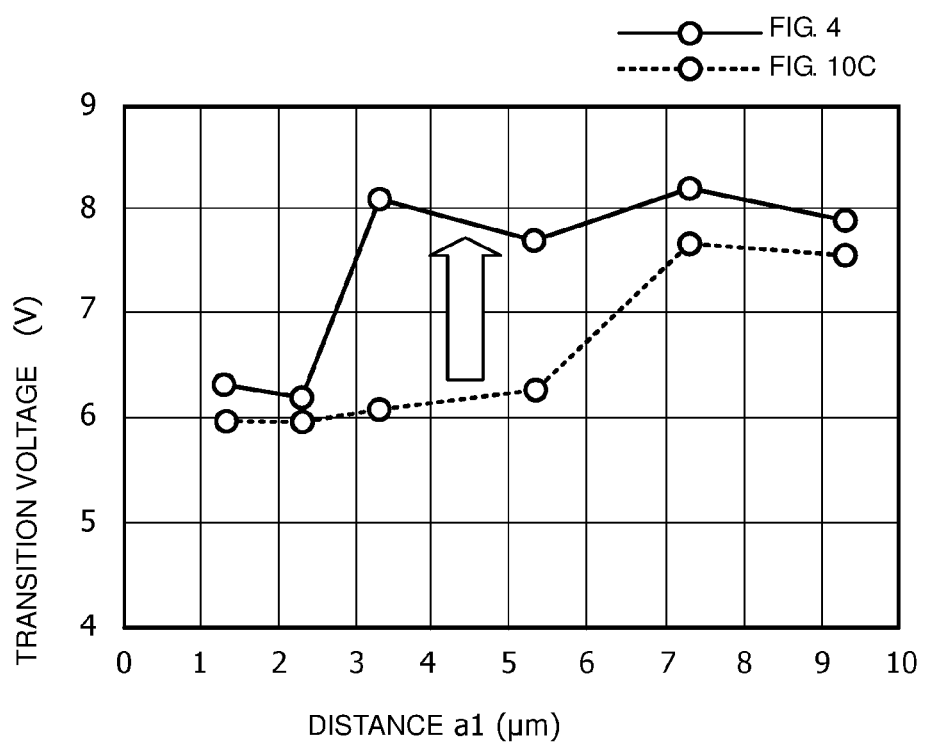
FIG. 11 is a graph showing measurement results of transition voltages Vt of samples in which positional relationships of an emitter layer, an emitter wiring line, and an ohmic contact interface are those illustrated in FIGS. 10B and 10C.

FIG. 11 is a graph showing measurement results of transition voltages Vt of samples in which the positional relationships of an emitter layer 31, an emitter wiring line 34, and an ohmic contact interface 35 are those illustrated in FIGS. 10B and 10C. The horizontal axis represents the distance a1 with respect to the longitudinal direction in units of "µm", and the vertical axis represents the transition voltage Vt in units of "V". The solid line and the dashed line of the graph in FIG. 11 represent the measurement results of the sample corresponding to the embodiment illustrated in FIG. 4 and the sample corresponding the example illustrated in FIG. 10C, respectively.

The samples actually prepared above each have the double-emitter structure illustrated in FIG. 8A. In the sample corresponding to the embodiment illustrated in FIG. 4, the layout in the HBT according to the embodiment illustrated in FIG. 4 is used as the layout of the emitter layer 31, the emitter electrode 32, and the emitter wiring line 34 in each of the two emitter structures. More specifically, the sample corresponding to the embodiment illustrated in FIG. 4 corresponds to an example in which one end portion of the emitter layer 31 has the configuration of the sample illustrated in FIG. 10B and the other end portion of the emitter layer 31 has the configuration of the sample illustrated in FIG. 10A. In the sample corresponding to the example illustrated in FIG. 10C, the layout illustrated in FIG. 10C is used as the layout of the emitter layer 31, the emitter electrode 32, and the emitter wiring line 34 in one end portion of each of the two emitter structures. In the other end portion, the layout illustrated in FIG. 10A is used in order to lead the emitter wiring line 34 to the outside.

The graph in FIG. 11 shows that the effect of increasing the transition voltage Vt is obtained when an end portion of the emitter wiring line 34 is disposed outside the center between an end portion of the emitter layer 31 and an end portion of the ohmic contact interface 35. The reason for the increase in the transition voltage Vt will be described below.

In a portion of an end region 37 of the emitter layer 31, the portion overlapping the emitter wiring line 34 (FIG. 6) in plan view, heat is transferred from the emitter layer 31 through the insulating film 61 mainly in the thickness direction and reaches the emitter wiring line 34. On the other hand, in a portion of an end region 37 of the emitter layer 31, the portion not overlapping the emitter wiring line 34 (FIG. 6) in plan view, heat is transferred from the emitter layer 31 through the insulating film 61 not only in the thickness direction but also in the lateral direction and reaches the emitter wiring line 34. The thermal conductivity of the insulating film 61 is lower than the thermal conductivity of the emitter wiring line 34. Therefore, in a portion of the end region 37 of the emitter layer 31, the portion not overlapping the emitter wiring line 34, heat generated in the emitter layer 31 is unlikely to be dissipated. Accordingly, in the case where a large portion of the end region 37 overlaps the emitter wiring line 34 (FIG. 10B), an increase in the temperature of the emitter layer 31 is suppressed compared with the case where a small portion of the end region 37 overlaps the emitter wiring line 34 (FIG. 10C). Consequently, a current flowing in the end region 37 further decreases. As a result, the current is unlikely to be influenced by the effect of thermal and electrical asymmetries, and the transition voltage Vt increases. Furthermore, considering the emitter wiring line 34 disposed on the emitter layer 31 and used for leading to the outside, the configuration illustrated in FIG. 10B has a higher thermal symmetry than the configuration illustrated in FIG. 10C. Therefore, the effect of the thermal asymmetry is reduced, and the effect of increasing the transition voltage Vt is further provided.

The results of the evaluation experiment shown in FIG. 11 and the considerations described above show that an end portion of the emitter wiring line 34 is preferably disposed outside the center between an end portion of the emitter layer 31 and an end portion of the ohmic contact interface 35 (including the outside of the end portion of the emitter layer 31 as illustrated in FIG. 10A).

In one end region 37 of the emitter layer 31, an end portion of the emitter wiring line 34 may be disposed between the corresponding end portion of the emitter layer 31 and the corresponding end portion of the ohmic contact interface 35, and the other end region 37 may be disposed such that the entire region thereof overlaps the emitter wiring line 34.

Next, a semiconductor device according to a modification of the first embodiment will be described with reference to FIG. 12.

Figure 12:
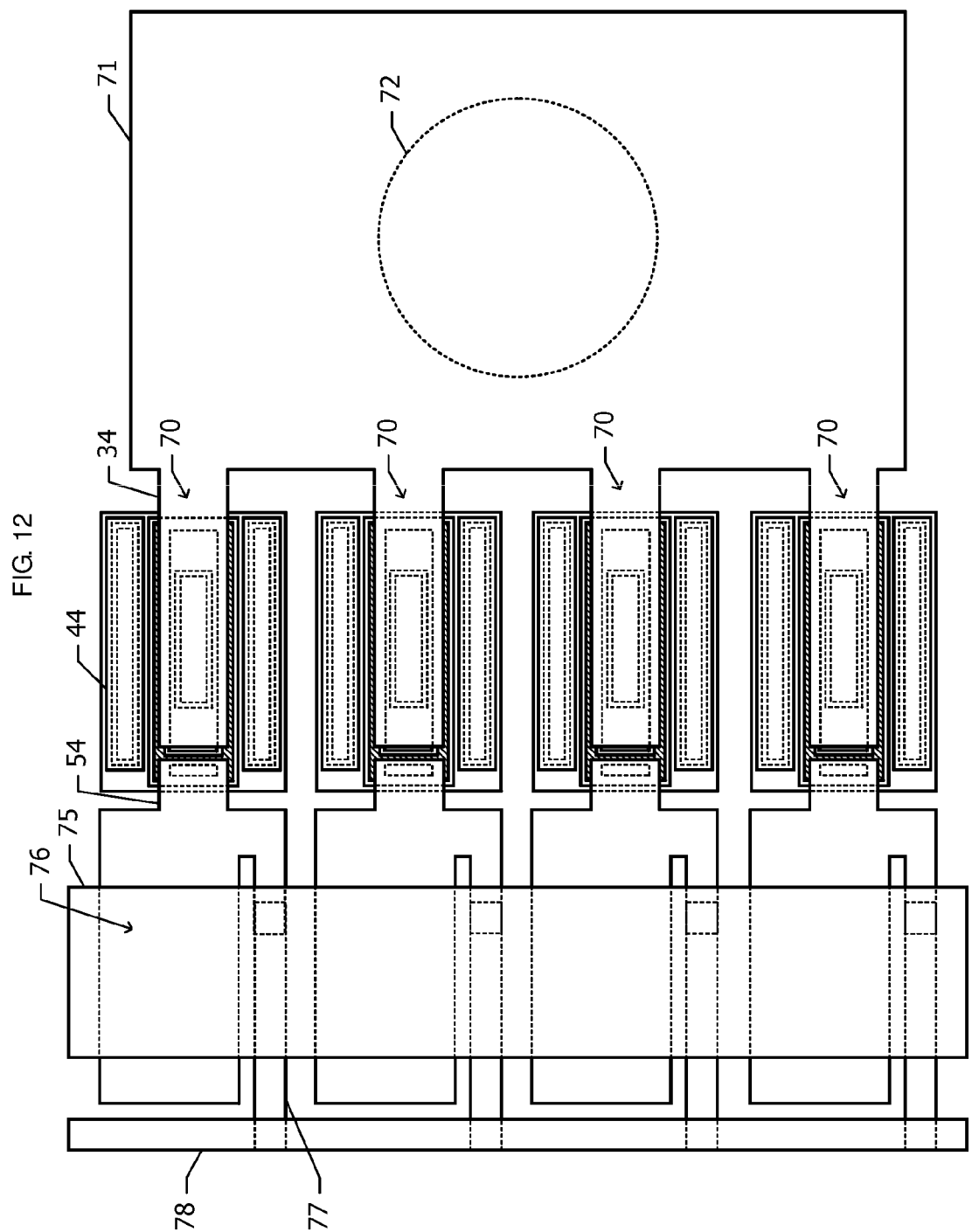
FIG. 12 is a plan view of a semiconductor device according to a modification of the first embodiment.

FIG. 12 is a plan view of a semiconductor device according to a modification of the first embodiment. The semiconductor device according to this modification includes a plurality of unit transistors 70. The unit transistors 70 each have the same configuration as the semiconductor device (FIGS. 4, 5, and 6) according to the first embodiment. The plurality of unit transistors 70 are arranged in a direction (in the up-down direction in FIG. 12) orthogonal to the longitudinal direction of an emitter layer 31.

An emitter wiring line 34 extends from each of the unit transistors 70 toward one side (the right side in FIG. 12) in the longitudinal direction. The emitter wiring lines 34 extending from the unit transistors 70 are continuous with an emitter common wiring line (ground wiring line) 71. A via hole 72 is formed inside the emitter common wiring line 71 in plan view. The via hole 72 extends through a substrate 60 (FIGS. 5 and 6) and reaches a back surface of the substrate 60. The emitter common wiring line 71 is connected to a ground electrode for external connection with a metal member disposed in the via hole 72 therebetween, the ground electrode being disposed on the back surface of the substrate 60.

A base wiring line 54 extends from each of the unit transistors 70 toward a direction (the left side in FIG. 12) opposite to the direction in which the emitter wiring line 34 extends. The width of each of the base wiring lines 54 is increased, and the base wiring lines 54 overlap a radio-frequency input wiring line 75. Portions where each of the base wiring lines 54 overlaps the radio-frequency input wiring line 75 function as a capacitor 76 with an MIM structure. Furthermore, the base wiring lines 54 are each connected to a bias wiring line 78 with a thin-film resistance 77 therebetween.

Although not shown in FIG. 12, collector wiring lines 44 of each of the unit transistors 70 are connected to a collector common wiring line (radio-frequency output wiring line) disposed above the emitter common wiring line 71. The emitter common wiring line 71 and the collector common wiring line may be independently connected to a Cu pillar bump, a solder bump, or the like.

As illustrated in FIG. 12, various wiring lines, circuit elements, the via hole, etc. are asymmetrically arranged in a lateral direction with respect to each of the unit transistors 70. Even in the laterally asymmetric configuration, the transition voltage Vt can be increased to extend the range of the SOA by using, as each of the unit transistors 70, the configuration of the semiconductor device according to the first embodiment.

Next, another modification of the first embodiment will be described with reference to FIG. 13.

Figure 13:
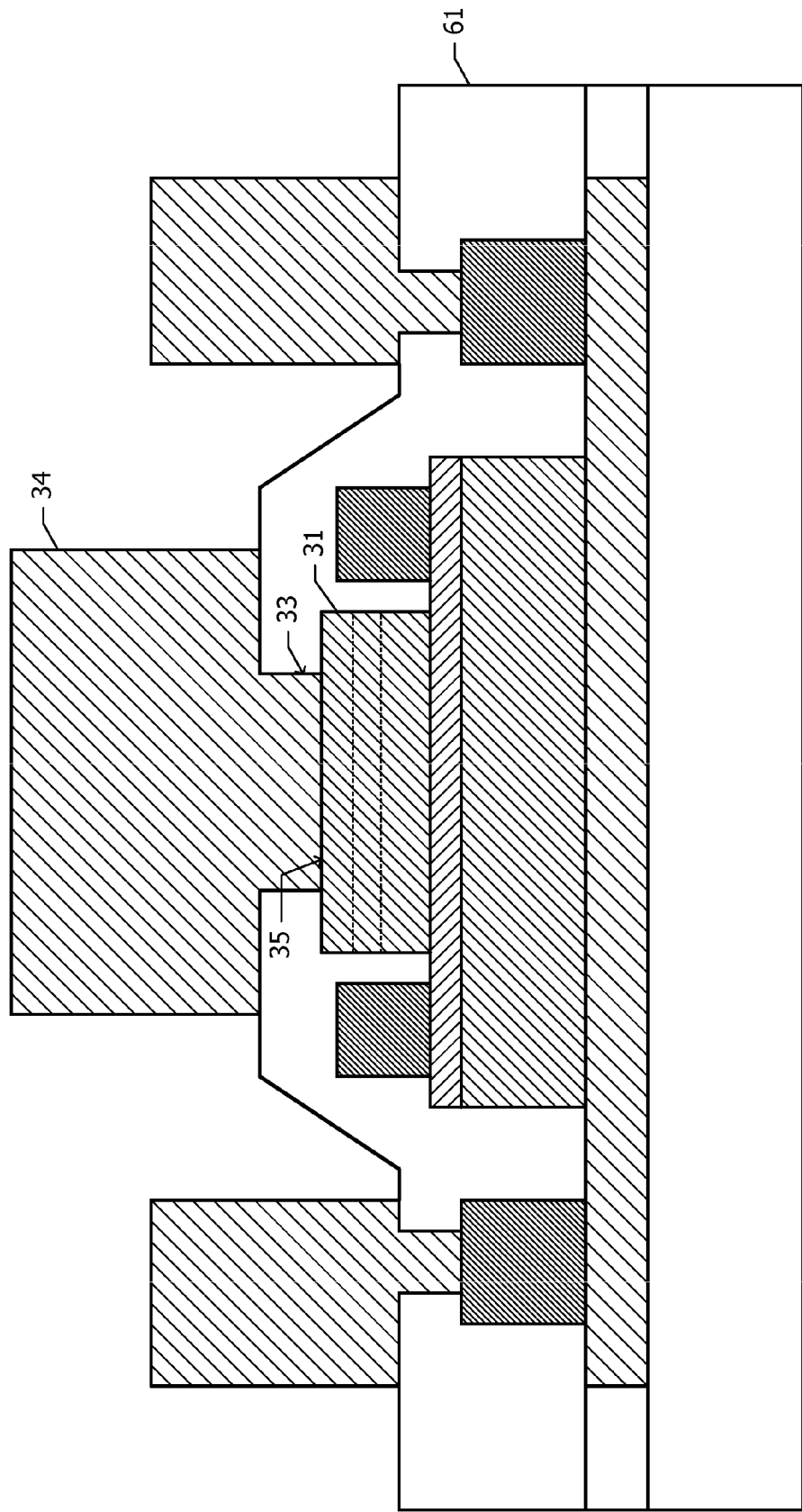
FIG. 13 is a sectional view of a semiconductor device according to another modification of the first embodiment.

FIG. 13 is a sectional view of a semiconductor device according to this modification. In the first embodiment, the emitter wiring line 34 is connected to the emitter layer 31 with the emitter electrode 32 therebetween as illustrated in FIG. 5. In this modification, an emitter wiring line 34 is directly connected to an emitter layer 31 as illustrated in FIG. 13. In this structure, the interface between the emitter wiring line 34 and the emitter layer 31 functions as an ohmic contact interface 35. A contact hole 33 formed in an insulating film 61 and the ohmic contact interface 35 completely overlap in plan view.

In this modification, the transition voltage Vt can be increased to extend the range of the SOA by determining the positional relationship between the emitter layer 31 and the ohmic contact interface 35 as in the case of the first embodiment.

Second Embodiment

Next, a semiconductor device according to a second embodiment will be described with reference to FIGS. 14A to 15B. Hereinafter, descriptions of configurations that are common to those of the semiconductor device according to the first embodiment (FIGS. 4, 5, and 6) will be omitted.

FIG. 14A is a plan view of an emitter layer 31, an emitter electrode 32, and an emitter wiring line 34 of a semiconductor device according to the second embodiment. In the first embodiment, the transition voltage Vt is increased by making the distance a1 with respect to the longitudinal direction of the emitter layer 31 longer than the distance a2 with respect to the width direction of the emitter layer 31. A gap (distance) from an edge of an emitter layer 31, the edge being located at an end portion in the longitudinal direction of the emitter layer 31, to an edge of a contact hole 33, the edge being located at an end portion in the longitudinal direction of the contact hole 33, is referred to as a distance b1. A gap (distance) from an edge of the emitter layer 31, the edge being parallel to the longitudinal direction of the emitter layer 31, to an edge of the contact hole 33, the edge being parallel to the longitudinal direction of the contact hole 33, is referred to as a distance b2. In the second embodiment, the transition voltage Vt is increased by making the distance b1 with respect to the longitudinal direction of the emitter layer 31 longer than the distance b2 with respect to the width direction of the emitter layer 31. The distance a1 with respect to the longitudinal direction and the distance a2 with respect to the width direction are substantially equal to each other. In one example, the distance a1 with respect to the longitudinal direction and the distance a2 with respect to the width direction are each about 0.5 μm or less, and the distance b1 with respect to the longitudinal direction is 4 μm or more.

FIG. 14B is a schematic sectional view taken along dash-dotted line 14B-14B in FIG. 14A. With respect to the longitudinal direction of the emitter layer 31, a region that overlaps the contact hole 33 is defined as a central region 36, and regions outside the contact hole 33 are defined as end regions 37 in the second embodiment. In the central region 36, a current flows from a junction interface between the base layer 51 and the emitter layer 31 toward the emitter wiring line 34 in the contact hole 33 through the emitter layer 31 and the emitter electrode 32 mainly in the thickness direction. In the end regions 37, a current flows from the junction interface between the base layer 51 and the emitter layer 31 through the emitter layer 31 mainly in the thickness direction and then flows in the emitter electrode 32 in the lateral direction.

In the second embodiment, the emitter access resistance is relatively high in the end regions 37 as in the case of the first embodiment. Accordingly, the effect of increasing the transition voltage Vt to extend the range of the SOA is obtained.

Next, a preferred dimension of the distance b1 with respect to the longitudinal direction of the emitter layer 31 will be described with reference to FIGS. 15A and 15B.

Figure 15A:
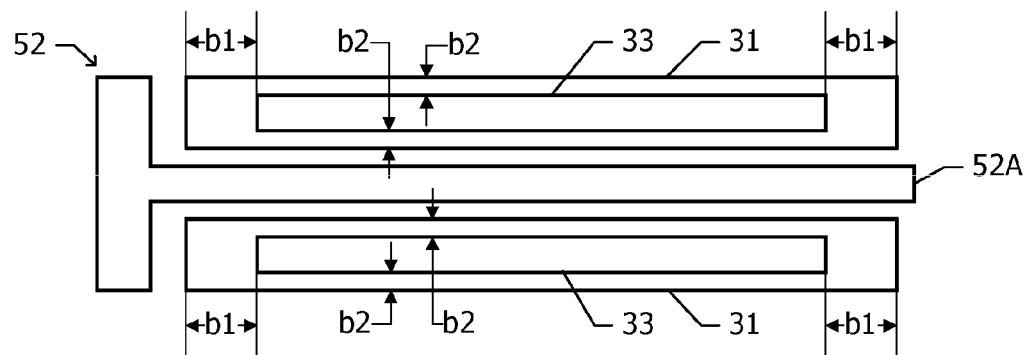
FIG. 15A is a plan view of emitter layers, contact holes, and a base electrode of an HBT prepared for evaluating a transition voltage Vt.

FIG. 15A is a plan view of emitter layers 31, contact holes 33, and a base electrode 52 of an HBT prepared for evaluating the transition voltage Vt. A plurality of HBTs having different distances b1 with respect to the longitudinal direction were actually prepared, and the transition voltage Vt was measured. The samples prepared above are so-called double-emitter HBTs in which emitter layers 31 are disposed on both sides of a base electrode main portion 52A. Each of the emitter layers 31 has a length of 40 μm and a width of 3 μm. The distance b1 with respect to the longitudinal direction in one end portion of the emitter layer 31 is equal to the distance b1 with respect to the longitudinal direction in the other end portion of the emitter layer 31. The distance b2 with respect to the width direction is 0.3 μm.

Figure 15B:
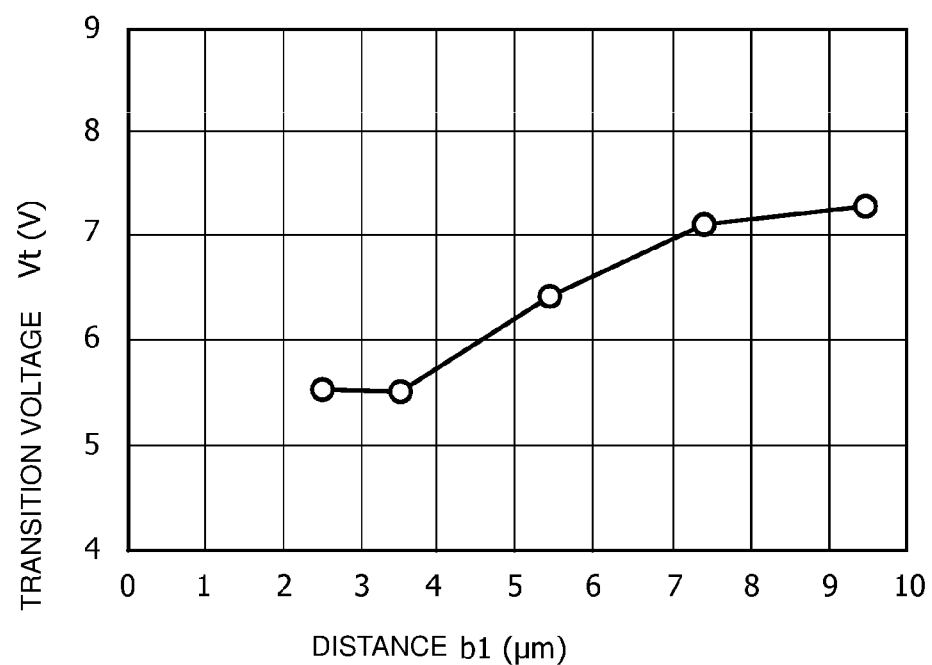
FIG. 15B is a graph showing measurement results a transition voltage Vt.

FIG. 15B is a graph showing measurement results of the transition voltage Vt. The horizontal axis represents the distance b1 with respect to the longitudinal direction in units of "μm", and the vertical axis represents the transition voltage Vt in units of "V". With an increase in the distance b1 with respect to the longitudinal direction from about 3 μm to about 10 μm, the transition voltage Vt gradually increases. For example, when the distance b1 with respect to the longitudinal direction is 2.5 μm or more and 3.5 μm or less (i.e., from 2.5 μm to 3.5 μm), the increase in the transition voltage Vt is not observed.

The results of the evaluation experiment in FIG. 15B show that the effect of increasing the transition voltage Vt is obtained when the distance b1 with respect to the longitudinal direction is 4 μm or more. When the distance b1 with respect to the longitudinal direction is 7 μm or more, the effect is significantly observed.

In the second embodiment, the increase in the emitter access resistance in the end regions 37 (FIG. 14B) is due to the sheet resistance of the emitter electrode 32 (FIG. 14B). In contrast, in the first embodiment, the increase in the emitter access resistance in the end regions 37 is due to the sheet resistance of the emitter layer 31 (FIG. 6). The sheet resistance of the emitter electrode 32 (about 0.5 Ω/sq. or more and about 10 Ω/sq. or less—i.e., from about 0.5 Ω/sq. to about 10 Ω/sq.) is lower than the sheet resistance of the emitter layer 31 (about 20 Ω/sq. or more and about 50 Ω/sq. or less—i.e., from about 20 Ω/sq. to about 50 Ω/sq.). Therefore, the tendency of the increase in the transition voltage Vt in the second embodiment (FIG. 15B) is gentler than the tendency of the increase in the transition voltage Vt in the first embodiment (FIG. 8B).

In order to obtain the effect of increasing the transition voltage Vt, the distance b1 with respect to the longitudinal direction is not necessarily increased in both end portions of the emitter layer 31 as in the case of the first embodiment. A certain effect of increasing the transition voltage Vt is obtained as long as the distance b1 with respect to the longitudinal direction is increased in at least one end portion of the emitter layer 31. For example, the difference in dimension with respect to the longitudinal direction between the emitter layer 31 and the contact hole 33 (double the distance b1 with respect to the longitudinal direction) is preferably larger than the difference in dimension with respect to the width direction between the emitter layer 31 and the contact hole 33 (double the distance b2 with respect to the width direction). In particular, the difference in dimension with respect to the longitudinal direction between the emitter layer 31 and the contact hole 33 is preferably 10 times or more the difference in dimension with respect to the width direction between the emitter layer 31 and the contact hole 33. When one end portion of the emitter layer 31 is focused on, the distance b1 with respect to the longitudinal direction is preferably 5 times or more the difference in dimension with respect to the width direction between the emitter layer 31 and the contact hole 33 in at least one end portion.

Next, a relative preferred positional relationship of an emitter layer 31, a contact hole 33, and an emitter wiring line 34 will be described.

As in the case where the description has been made in the first embodiment with reference to FIGS. 10A to 11, an end portion of the emitter wiring line 34 (FIG. 14A) is preferably disposed outside the center between an end portion of the emitter layer 31 and an end portion of the contact hole 33 with respect to the longitudinal direction of the emitter layer 31. The emitter wiring line 34 may include the entire region of the end regions 37 in plan view. The use of this configuration suppresses an increase in the temperature of the end regions 37 and enables the effect of increasing the transition voltage Vt to be enhanced.

Next, a modification of the second embodiment will be described. In the second embodiment, the emitter electrode 32 is disposed inside the emitter layer 31. Alternatively, the emitter electrode 32 may extend to the outside of the emitter layer 31 in plan view. In this case, the relative positional relationship between the emitter layer 31 and the contact hole 33 is also the preferred relationship described above. In this modification, the emitter layer 31 is formed by self-alignment with a processing technique such as dry etching by using the emitter electrode 32 as an etching mask. In this case, the emitter electrode 32 disposed on the emitter layer 31 has a structure in which the emitter electrode 32 slightly protrudes from edges of the emitter layer 31 and remains as an overhanging portion.

Third Embodiment

Next, a semiconductor device according to a third embodiment will be described with reference to FIG. 16. Hereinafter, descriptions of configurations that are common to those of the semiconductor devices according to the first embodiment and the second embodiment will be omitted.

FIG. 16 is a plan view of an emitter layer 31, an emitter electrode 32, an ohmic contact interface 35, a contact hole 33, and an emitter wiring line 34 of a semiconductor device according to the third embodiment. The emitter electrode 32 completely overlaps the ohmic contact interface 35 in plan view. In the first embodiment, the distance a1 with respect to the longitudinal direction is longer than the distance a2 with respect to the width direction. In the second embodiment, the distance b1 with respect to the longitudinal direction is longer than the distance b2 with respect to the width direction. In the third embodiment, both the distance a1 and the distance b1 with respect to the longitudinal direction are respectively longer than the distance a2 and the distance b2 with respect to the width direction.

The comparison between FIG. 8B and FIG. 15B shows that a significant effect of increasing the transition voltage Vt is obtained in the case where the distance a1 from an end portion of the emitter layer 31 to an end portion of the emitter electrode 32 with respect to the longitudinal direction is increased, compared with the case where the distance b1 from an end portion of the emitter layer 31 to an end portion of the contact hole 33 with respect to the longitudinal direction is increased. However, an increase in the distance a1 decreases the area of the ohmic contact interface 35, and thus there is a concern about a decrease in the radio-frequency characteristics of the HBT. Accordingly, in FIG. 16, the distance a1 and the distance b1 with respect to the longitudinal direction are preferably determined from the viewpoint of suppressing a decrease in the radio-frequency characteristics and the viewpoint of increasing the transition voltage Vt.

Fourth Embodiment

Next, a semiconductor device according to a fourth embodiment will be described with reference to FIG. 17. Hereinafter, descriptions of configurations that are common to those of the semiconductor device according to the first embodiment (FIGS. 4, 5, and 6) will be omitted.

Figure 17:
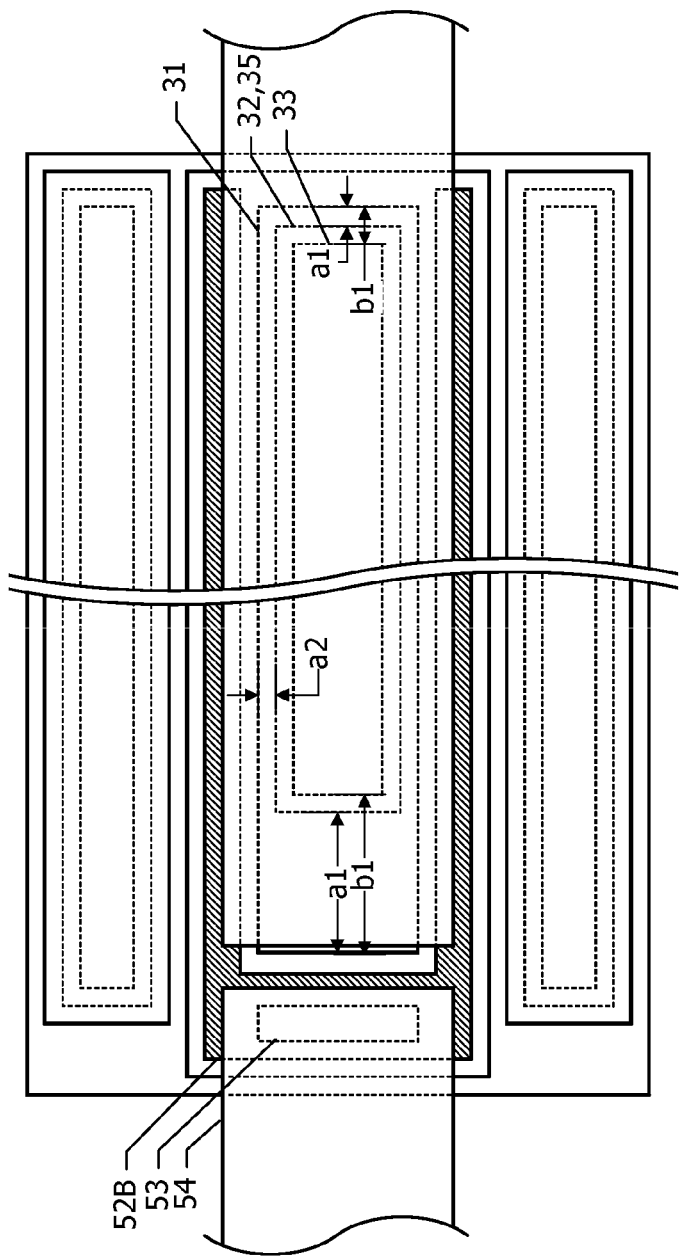
FIG. 17 is a plan view of a semiconductor device according to a fourth embodiment.

FIG. 17 is a plan view of a semiconductor device according to the fourth embodiment. In the first embodiment, the distance a1 with respect to the longitudinal direction is longer than the distance a2 with respect to the width direction in both end portions of the emitter layer 31. In the fourth embodiment, the distance a1 with respect to the longitudinal direction is longer than the distance a2 with respect to the width direction in one end portion of an emitter layer 31. In the other end portion, the distance a1 with respect to the longitudinal direction is substantially equal to the distance a2 with respect to the width direction. The distance a1 with respect to the longitudinal direction is preferably long in the end portion adjacent to a base electrode pad portion 52B (the end portion on the left side in FIG. 17).

A current flowing in the emitter layer 31 is easily influenced by thermal and electrical effects from, for example, the base electrode pad portion 52B, a contact hole 53, and a base wiring line 54 in the end portion on the left side compared with the end portion on the right side in FIG. 17. The distance a1 with respect to the longitudinal direction is determined to be relatively long in an end portion of the emitter layer 31, the end portion being more easily influenced by thermal and electrical effects, to thereby offset the effects. Consequently, the kink K is unlikely to appear in the collector current-base voltage characteristics (FIG. 3). As a result, the effect of increasing the transition voltage Vt is obtained. The distance a1 with respect to the longitudinal direction in the end portion adjacent to the base electrode pad portion 52B is preferably 3 µm or more. Alternatively, the distance a1 with respect to the longitudinal direction in the end portion adjacent to the base electrode pad portion 52B is preferably 5 times or more the distance a2 with respect to the width direction.

In the end portion on the side opposite to the contact hole 53, the distance a1 with respect to the longitudinal direction is preferably shorter than the distance a1 with respect to the longitudinal direction in the end portion adjacent to the base electrode pad portion 52B. The distance b1 with respect to the longitudinal direction in the end portion on the side opposite to the base electrode pad portion 52B is also preferably shorter than the distance b1 with respect to the longitudinal direction in the end portion adjacent to the base electrode pad portion 52B. For example, the distance a1 and the distance b1 with respect to the longitudinal direction in the end portion on the side opposite to the base electrode pad portion 52B are each preferably less than 1 µm.

The ohmic contact interface 35 in the fourth embodiment has a larger area than the ohmic contact interface 35 in the first embodiment. As a result, an HBT having good radio-frequency characteristics in a high-current range is obtained compared with the first embodiment.

Fifth Embodiment

Next, a semiconductor device according to a fifth embodiment will be described with reference to FIG. 18. Hereinafter, descriptions of configurations that are common to those of the semiconductor device according to the second embodiment (FIGS. 14A and 14B) will be omitted.

Figure 18:
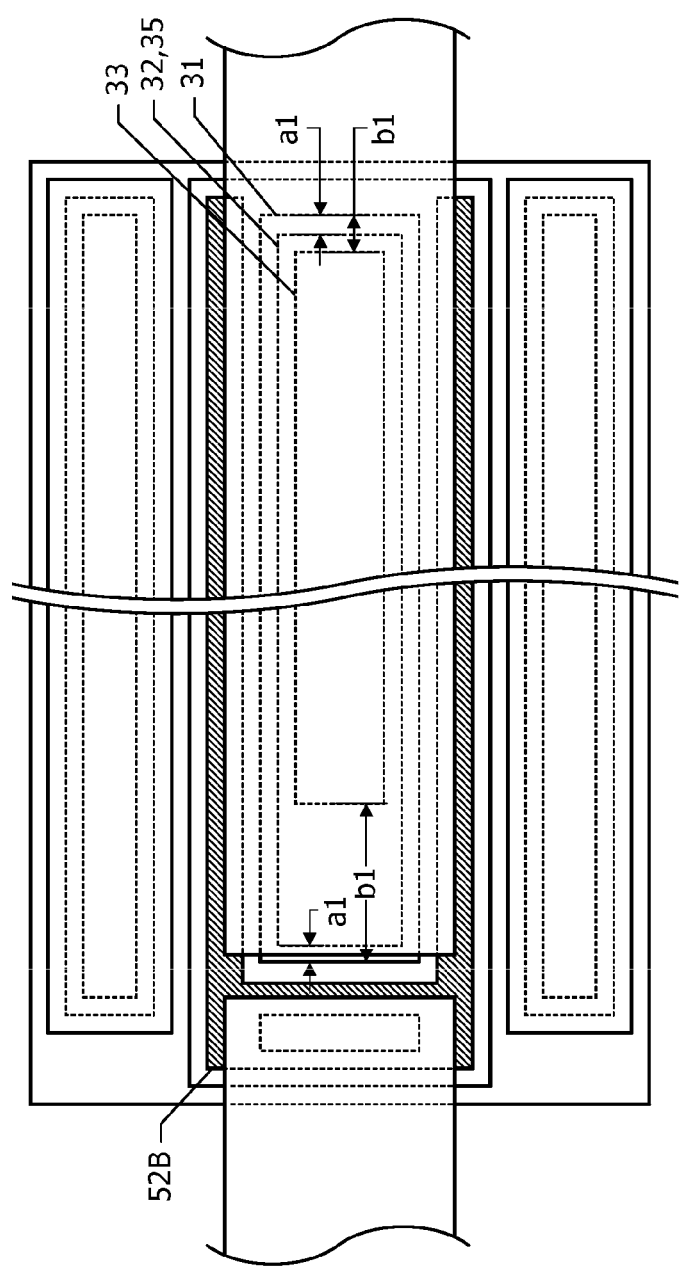
FIG. 18 is a plan view of a semiconductor device according to a fifth embodiment.

FIG. 18 is a plan view of a semiconductor device according to the fifth embodiment. In the second embodiment, the distance b1 with respect to the longitudinal direction is longer than the distance b2 with respect to the width direction in both end portions of the emitter layer 31. In the fifth embodiment, the distance b1 with respect to the longitudinal direction is longer than the distance b2 with respect to the width direction in one end portion of an emitter layer 31. In the other end portion, the distance b1 with respect to the longitudinal direction is substantially equal to the distance b2 with respect to the width direction. In particular, the distance b1 with respect to the longitudinal direction is preferably long in the end portion adjacent to a base electrode pad portion 52B (on the left side in FIG. 18).

In the fifth embodiment, the kink K (FIG. 3) is unlikely to appear in the collector current-base voltage characteristics as in the second embodiment. As a result, the effect of increasing the transition voltage Vt is obtained. The distance b1 with respect to the longitudinal direction in the end portion adjacent to the base electrode pad portion 52B is preferably 4 µm or more. Alternatively, the distance b1 with respect to the longitudinal direction in the end portion adjacent to the base electrode pad portion 52B is preferably 5 times or more the distance b2 with respect to the width direction. The distance b1 with respect to the longitudinal direction in the end portion on the side opposite to the base electrode pad portion 52B is preferably shorter than the distance b1 with respect to the longitudinal direction in the end portion adjacent to the base electrode pad portion 52B. For example, the distance b1 with respect to the longitudinal direction in the end portion on the side opposite to the base electrode pad portion 52B is preferably 1 µm or less. The distance a1 with respect to the longitudinal direction is preferably 1 μm or less in both end portions of the emitter layer 31.

Sixth Embodiment

Next, a semiconductor device according to a sixth embodiment will be described with reference to FIG. 19. Hereinafter, descriptions of configurations that are common to those of the semiconductor device according to the fourth embodiment (FIG. 17) will be omitted.

Figure 19:
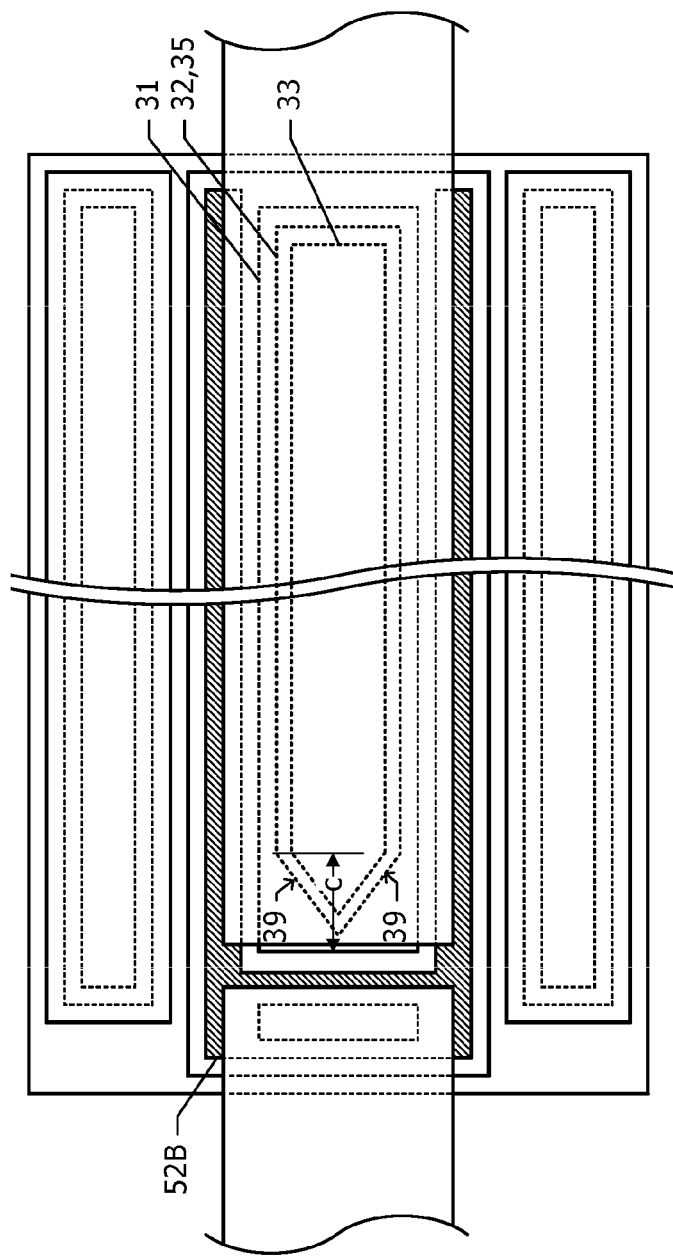
FIG. 19 is a plan view of a semiconductor device according to a sixth embodiment.

FIG. 19 is a plan view of a semiconductor device according to the sixth embodiment. In the fourth embodiment, the distance a1 with respect to the longitudinal direction is longer than the distance a2 with respect to the width direction in the end portion adjacent to the base electrode pad portion 52B. In the sixth embodiment, instead of making the distance a1 with respect to the longitudinal direction long, an emitter electrode 32 has a planar shape in which two corners of a rectangle are chamfered.

Oblique sides 39 formed by chamfering two adjacent corners of the emitter electrode 32 are continuous with each other, so that the emitter electrode 32 has a pentagonal planar shape. The angle formed by each of the oblique sides 39 and the longitudinal direction of an emitter layer 31 is, for example, 45°. The angle is not limited to 45°. The planar shape of an ohmic contact interface 35 completely overlaps the planar shape of the emitter electrode 32. The planar shape of a contact hole 33 for an emitter also reflects the chamfering of the corners of the emitter electrode 32 and is a shape in which two corners of a rectangle are chamfered. A distance from an end portion of the emitter layer 31 in the longitudinal direction to a farthest position of a chamfered portion with respect to the longitudinal direction is referred to as a distance c. The distance c is preferably 3 μm or more as in the distance a1 of the fourth embodiment (FIG. 17).

In the sixth embodiment, the emitter access resistance in the chamfered portion of the emitter layer 31 is increased. Accordingly, the kink K (FIG. 3) is unlikely to appear in the collector current-base voltage characteristics as in the case of the fourth embodiment. As a result, the effect of increasing the transition voltage Vt to extend the range of the SOA is obtained. The ohmic contact interface 35 in the sixth embodiment has a larger area than the ohmic contact interface 35 in the fourth embodiment (FIG. 17). Therefore, a decrease in the radio-frequency characteristics can be suppressed.

Seventh Embodiment

Next, a semiconductor device according to a seventh embodiment will be described with reference to FIG. 20. Hereinafter, descriptions of configurations that are common to those of the semiconductor device according to the sixth embodiment (FIG. 19) will be omitted.

Figure 20:
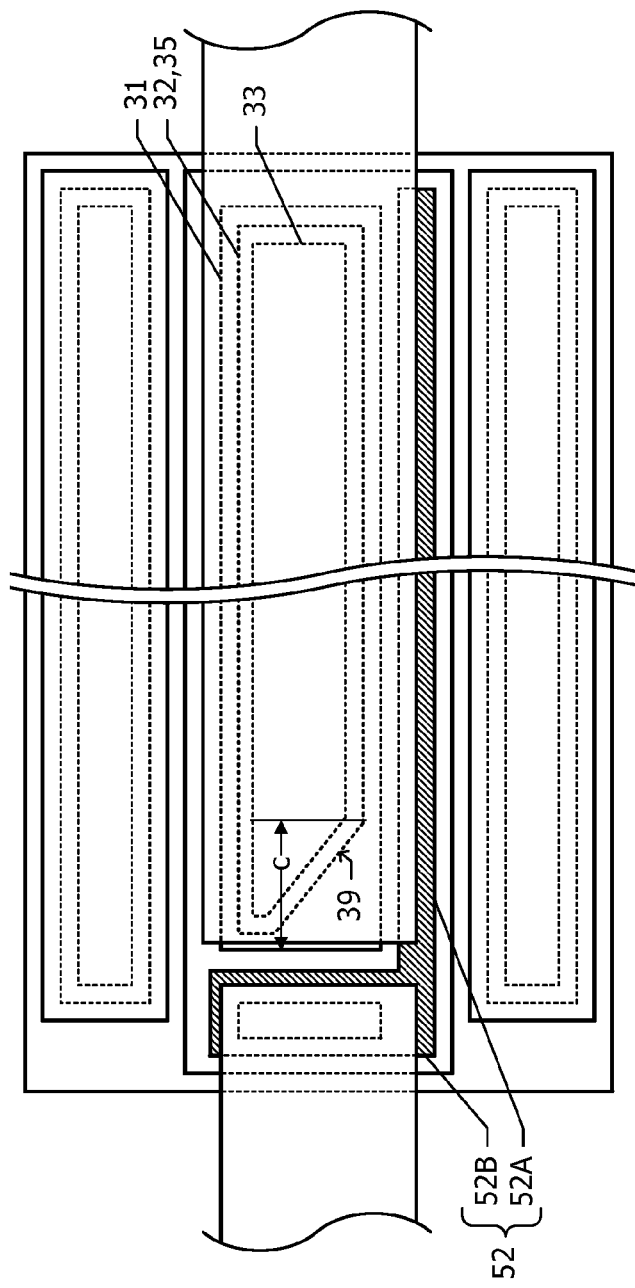
FIG. 20 is a plan view of a semiconductor device according to a seventh embodiment.

FIG. 20 is a plan view of a semiconductor device according to the seventh embodiment. In the sixth embodiment (FIG. 19), a base electrode 52 includes two base electrode main portions 52A and a base electrode pad portion 52B that connects the base electrode main portions 52A to each other as in the reference example (FIG. 1). In the seventh embodiment, a base electrode 52 incudes a single base electrode main portion 52A and a base electrode pad portion 52B continuous with an end portion of the base electrode main portion 52A. The base electrode main portion 52A is disposed on one side of an emitter layer 31 and extends in a direction parallel to the longitudinal direction of the emitter layer 31. The base electrode 52 including the base electrode main portion 52A and the base electrode pad portion 52B has a planar shape similar to the form of the letter L.

In the sixth embodiment (FIG. 19), two corners in one end portion of the emitter electrode 32 are chamfered. In the seventh embodiment, only one corner is chamfered. The chamfered corner is one that faces a corner portion of the base electrode 52 having a shape of the letter L. The angle formed by a chamfered oblique side 39 and the longitudinal direction of the emitter layer 31 is, for example, 45°. The angle is not limited to 45°.

In the seventh embodiment, the emitter access resistance in the chamfered portion of the emitter layer 31 is increased as in the sixth embodiment. Accordingly, the kink K (FIG. 3) is unlikely to appear in the collector current-base voltage characteristics as in the case of the sixth embodiment. As a result, the effect of increasing the transition voltage Vt to extend the range of the SOA is obtained.

The distance c from an end portion of the emitter layer 31 in the longitudinal direction to a farthest position of the chamfered portion with respect to the longitudinal direction is preferably 3 μm or more as in the sixth embodiment. In the seventh embodiment, two corners in an end portion of an emitter electrode 32, the end portion being adjacent to the base electrode pad portion 52B, may be chamfered.

Eighth Embodiment

Next, a semiconductor device according to an eighth embodiment will be described with reference to FIG. 21. Hereinafter, descriptions of configurations that are common to those of the semiconductor device according to the seventh embodiment (FIG. 20) will be omitted.

Figure 21:
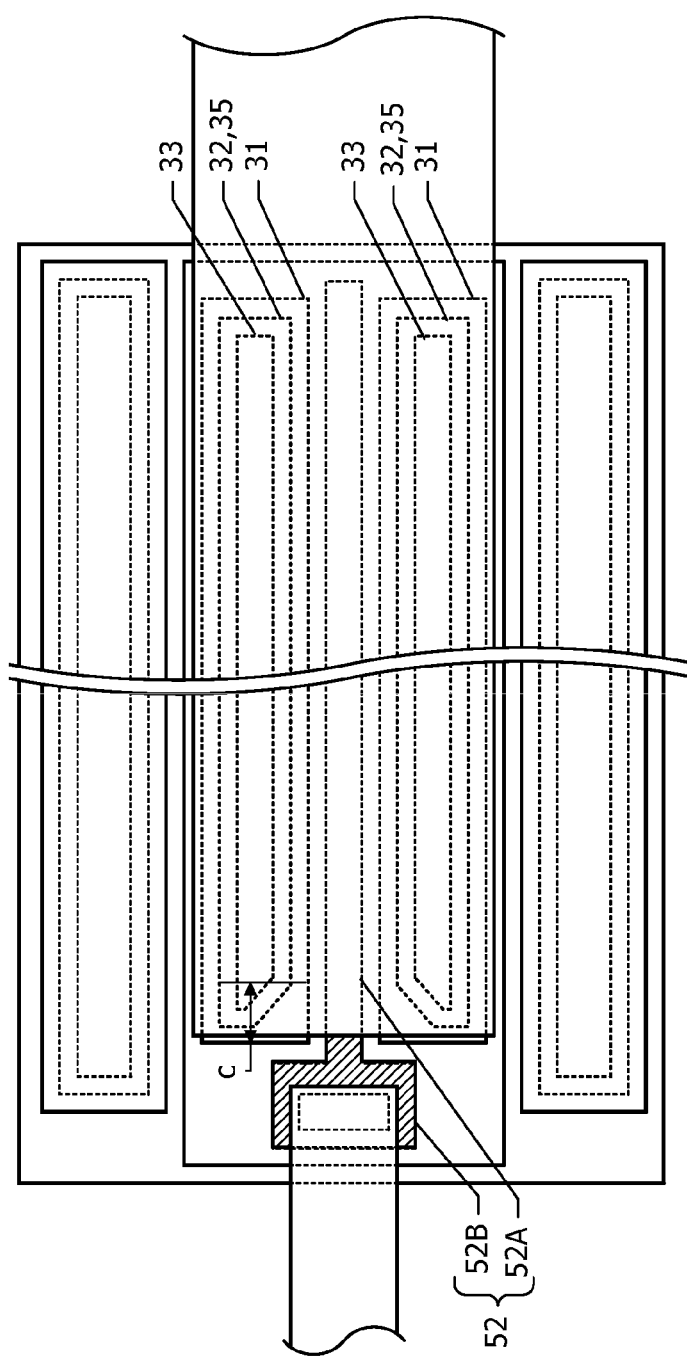
FIG. 21 is a plan view of a semiconductor device according to an eighth embodiment.

FIG. 21 is a plan view of a semiconductor device according to the eighth embodiment. Two emitter layers 31 parallel to each other are disposed in the eighth embodiment while one emitter layer 31 is disposed in the seventh embodiment (FIG. 20). An emitter electrode 32 and a contact hole 33 are disposed so as to correspond to each of the two emitter layers 31.

A base electrode main portion 52A is disposed between the two emitter layers 31. A base electrode pad portion 52B is disposed at one end portion (the left end in FIG. 21) of the base electrode main portion 52A. A base electrode 52 including the base electrode main portion 52A and the base electrode pad portion 52B has a planar shape similar to the form of the letter T.

Each of the emitter electrodes 32 has a planar shape in which one corner of a rectangle is chamfered as in the case of the seventh embodiment (FIG. 20). The chamfered corners are those that face a portion where the base electrode main portion 52A and the base electrode pad portion 52B are connected to each other.

In the eighth embodiment, the emitter access resistance in the chamfered portion of each of the emitter layers 31 is increased as in the seventh embodiment. Accordingly, the kink K (FIG. 3) is unlikely to appear in the collector current-base voltage characteristics as in the case of the seventh embodiment. As a result, the effect of increasing the transition voltage Vt to extend the range of the SOA is obtained.

The distance c from an end portion of each of the emitter layers 31 in the longitudinal direction to a farthest position of the chamfered portion with respect to the longitudinal direction is preferably 3 μm or more as in the seventh embodiment. In the eighth embodiment, two corners in an end portion of each of the emitter electrodes 32, the end portion being adjacent to the base electrode pad portion 52B, may be chamfered.

Ninth Embodiment

Next, a semiconductor device according to a ninth embodiment will be described with reference to FIG. 22. Hereinafter, descriptions of configurations that are common to those of the semiconductor device according to the sixth embodiment (FIG. 19) will be omitted.

Figure 22:
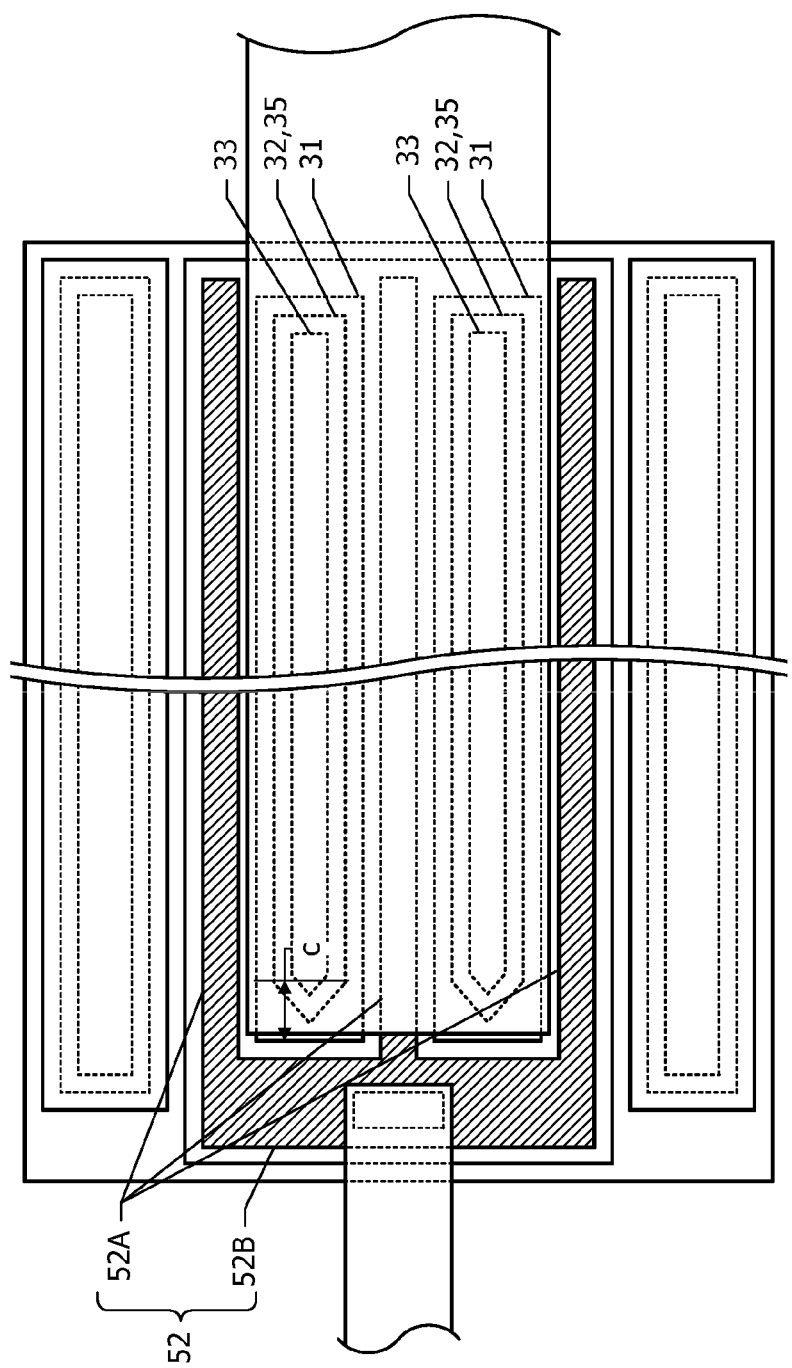
FIG. 22 is a plan view of a semiconductor device according to a ninth embodiment.

FIG. 22 is a plan view of a semiconductor device according to the ninth embodiment. Two emitter layers 31 parallel to each other are disposed in the ninth embodiment while one emitter layer 31 is disposed in the sixth embodiment (FIG. 19). An emitter electrode 32 and a contact hole 33 are disposed so as to correspond to each of the two emitter layers 31.

Base electrode main portions 52A are disposed between the two emitter layers 31 and outside each of the two emitter layers 31. A base electrode pad portion 52B connects the three base electrode main portions 52A together. A base electrode 52 including the three base electrode main portions 52A and the base electrode pad portion 52B has a planar shape similar to the form of the letter E. Each of the emitter electrodes 32 has a planar shape in which two corners of a rectangle are chamfered as in the case of the sixth embodiment (FIG. 19).

In the ninth embodiment, the emitter access resistance in the chamfered portion of each of the emitter layers 31 is increased as in the sixth embodiment. Accordingly, the kink K (FIG. 3) is unlikely to appear in the collector current-base voltage characteristics as in the case of the sixth embodiment. As a result, the effect of increasing the transition voltage Vt to extend the range of the SOA is obtained.

The distance c from an end portion of each of the emitter layers 31 in the longitudinal direction to a farthest position of the chamfered portion with respect to the longitudinal direction is preferably 3 μm or more as in the sixth embodiment.

Tenth Embodiment

Next, semiconductor devices according to a tenth embodiment will be described with reference to FIGS. 23A, 23B, and 23C. Hereinafter, descriptions of configurations that are common to those of the semiconductor device according to the first embodiment (FIG. 4) will be omitted.

Figure 23A:
FIGS. 23A, 23B, and 23C are plan views of an emitter layer, an emitter electrode, a contact hole, and an ohmic contact interface of semiconductor devices according to a tenth embodiment and modifications of the tenth embodiment.
Figure 23B:
Figure 23C:
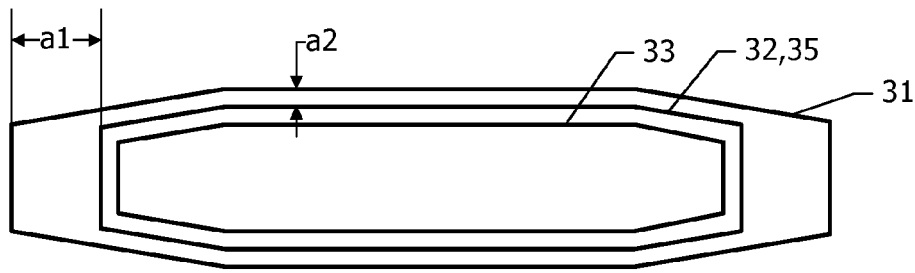

FIGS. 23A, 23B, and 23C are plan views of an emitter layer 31, an emitter electrode 32, a contact hole 33, and an ohmic contact interface 35 of semiconductor devices according to the tenth embodiment and modifications of the tenth embodiment. In the first embodiment (FIG. 4), the emitter layer 31 has a rectangular planar shape. In contrast, in the example illustrated in FIG. 23A, the emitter layer 31 has a planar shape in which an isosceles triangle is added to each of short sides on both ends of a rectangle, in other words, a long and narrow, hexagonal planar shape. In the example illustrated in FIG. 23B, the emitter layer 31 has a planar shape in which four corners of a rectangle are rounded. In the example illustrated in FIG. 23C, the emitter layer 31 has an octagonal planar shape in which four corners of a rectangle are chamfered.

In each of the examples, the distance a1 with respect to the longitudinal direction from an end portion of the emitter layer 31 in the longitudinal direction to the ohmic contact interface 35 is longer than the distance a2 with respect to the width direction. Therefore, the kink K (FIG. 3) is unlikely to appear in the collector current-base voltage characteristics as in the case of the first embodiment. As a result, the effect of increasing the transition voltage Vt to extend the range of the SOA is obtained.

Eleventh Embodiment

Next, a semiconductor device according to an eleventh embodiment will be described with reference to FIG. 24. Hereinafter, descriptions of configurations that are common to those of the semiconductor device according to the first embodiment will be omitted.

Figure 24:
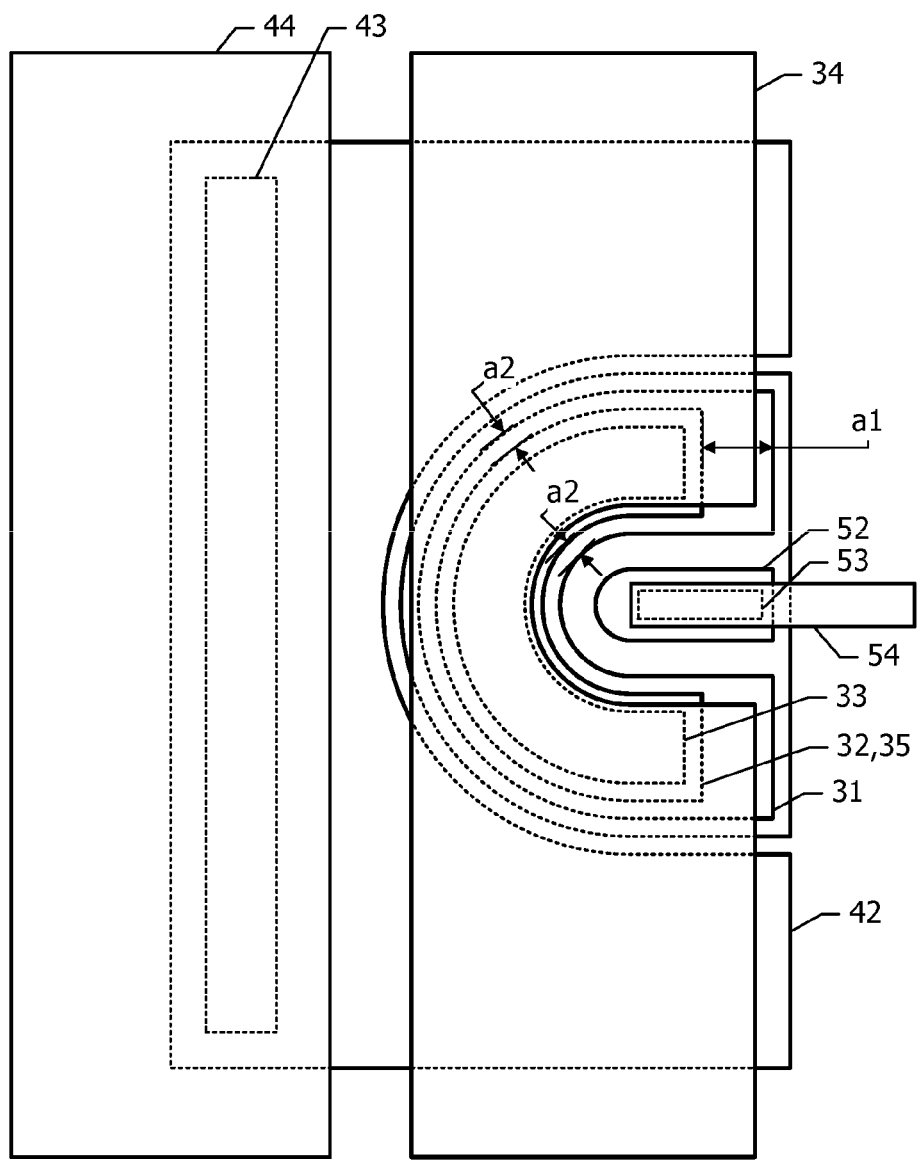
FIG. 24 is a plan view of a semiconductor device according to an eleventh embodiment.

FIG. 24 is a plan view of a semiconductor device according to the eleventh embodiment. In the first embodiment, the emitter layer 31 (FIG. 4) has a rectangular planar shape that is long in a direction parallel to one imaginary straight line. In the eleventh embodiment, an emitter layer 31 has a planar shape similar to the form of the letter U formed by curving a rectangle. In this case, a direction along a center line of the curved rectangle (the circumferential direction of the curved portion) can be defined as a longitudinal direction of the emitter layer 31. A direction orthogonal to the longitudinal direction (the radial direction of the curved portion) can be defined as a width direction of the emitter layer 31.

An emitter electrode 32 and a contact hole 33 also have planar shapes similar to the form of the letter U, as in the emitter layer 31.

As in the case of the first embodiment, a gap between an edge of the emitter layer 31, the edge being located at an end portion in the longitudinal direction of the emitter layer 31, and an edge of the emitter electrode 32, the edge being located at an end portion in the longitudinal direction of the emitter electrode 32, is referred to as a distance a1 with respect to the longitudinal direction. A gap between an edge along the longitudinal direction (an edge of a curved portion) of the emitter layer 31 and an edge along the longitudinal direction (an edge of a curved portion) of the emitter electrode 32 is referred to as a distance a2 with respect to the width direction. The distance a2 with respect to the width direction in the curved portion corresponds to, for example, a distance in the radial direction between an edge of the emitter layer 31 and an edge of the emitter electrode 32 on the outer circumferential side or a distance in the radial direction between an edge of the emitter layer 31 and an edge of the emitter electrode 32 on the inner circumferential side.

An emitter wiring line 34 is disposed so as to overlap the emitter electrode 32. The emitter wiring line 34 is connected to the emitter electrode 32 through the contact hole 33.

A base electrode 52 is disposed in a region surrounded by the U-shaped emitter layer 31. A base wiring line 54 is disposed so as to overlap the base electrode 52. The base wiring line 54 is connected to the base electrode 52 through a contact hole 53.

A collector electrode 42 is disposed so as to surround the emitter layer 31 from the outside of the curved portion. A collector wiring line 44 is disposed so as to overlap the collector electrode 42. The collector wiring line 44 is connected to the collector electrode 42 through a contact hole 43.

In the eleventh embodiment, the distance a1 with respect to the longitudinal direction of the emitter layer 31 is longer than the distance a2 with respect to the width direction as in the case of the first embodiment. Therefore, the kink K (FIG. 3) is unlikely to appear in the collector current-base voltage characteristics as in the case of the first embodiment. As a result, the effect of increasing the transition voltage Vt to extend the range of the SOA is obtained. The distance a1 with respect to the longitudinal direction of the emitter layer 31 is preferably 3 μm or more as in the case of the first embodiment.

Twelfth Embodiment

Next, a semiconductor device according to a twelfth embodiment will be described with reference to FIG. 25. Hereinafter, descriptions of configurations that are common to those of the semiconductor device according to the sixth embodiment (FIG. 19) will be omitted.

Figure 25:
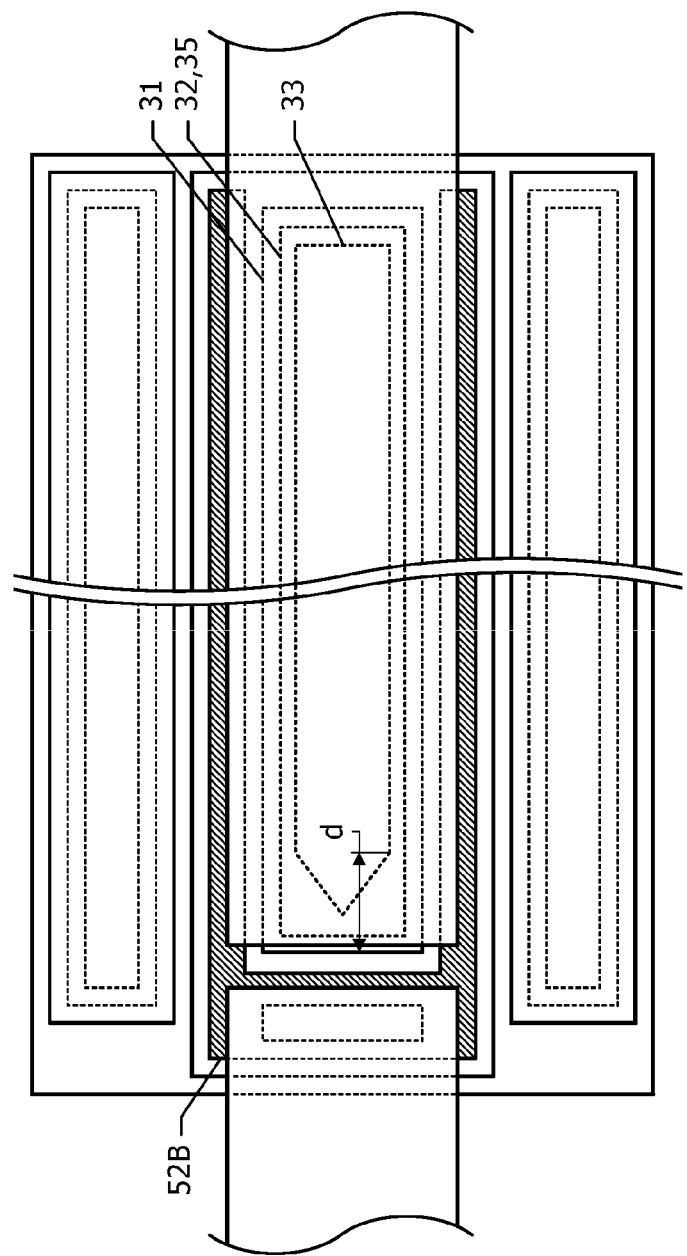
FIG. 25 is a plan view of a semiconductor device according to a twelfth embodiment.

FIG. 25 is a plan view of a semiconductor device according to the twelfth embodiment. In the sixth embodiment (FIG. 19), the emitter electrode 32 has a planar shape in which corners of a rectangle are chamfered. In the twelfth embodiment, a contact hole 33 for an emitter has a planar shape in which corners of a rectangle are chamfered. An emitter electrode 32 and an ohmic contact interface 35 each have a rectangular planar shape.

In the twelfth embodiment, a current flowing in an emitter layer 31 located right under the chamfered portion of the contact hole 33 is decreased as in the case of the second embodiment (refer to FIGS. 14A to 15B). Therefore, the kink K (FIG. 3) is unlikely to appear in the collector current-base voltage characteristics as in the case of the second embodiment. As a result, the effect of increasing the transition voltage Vt to extend the range of the SOA is obtained.

A distance from an end portion of the emitter layer 31 in the longitudinal direction to a farthest position of the chamfered portion with respect to the longitudinal direction is referred to as a distance d. The distance d is preferably 4 μm or more as in the case of the second embodiment.

Next, modifications of the twelfth embodiment will be described. In the twelfth embodiment, corners of the contact hole 33 for the emitter are chamfered instead of chamfering corners of the emitter electrode 32 (FIG. 19) of the sixth embodiment. At least one corner of the contact hole 33 for an emitter may be chamfered instead of chamfering at least one corner of the emitter electrode 32 of the semiconductor device according to the seventh embodiment (FIG. 20), the eighth embodiment (FIG. 21), or the ninth embodiment (FIG. 22). In such a case, the distance d is preferably 4 μm or more as in the case of the twelfth embodiment.

The embodiments and modifications described above are exemplary, and, needless to say, a partial replacement or combination of configurations described in different embodiments and modifications is possible. The same or similar operations and effects achieved by the same or similar configurations in a plurality of embodiments and modifications will not be mentioned in each of the embodiments. Furthermore, the present disclosure is not limited to the embodiments and modifications described above. For example, it is obvious for those skilled in the art that various changes, improvements, combinations, and the like can be made.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A semiconductor device comprising:
a collector layer, a base layer, and an emitter layer that are disposed on a substrate to form a bipolar transistor; and
an emitter electrode that is in ohmic contact with the emitter layer,
wherein
the emitter layer has a shape that is long in one direction in plan view,
a difference in dimension with respect to a longitudinal direction of the emitter layer between the emitter layer and an ohmic contact interface at which the emitter layer and the emitter electrode are in ohmic contact with each other is larger than a difference in dimension with respect to a width direction of the emitter layer between the emitter layer and the ohmic contact interface, and
the ohmic contact interface has a shape that is long in the same direction the emitter layer is long.

2. The semiconductor device according to claim 1, wherein the difference in dimension with respect to the longitudinal direction of the emitter layer between the emitter layer and the ohmic contact interface is 10 times or more the difference in dimension with respect to the width direction of the emitter layer between the emitter layer and the ohmic contact interface.

3. The semiconductor device according to claim 2, wherein a distance from an end portion of the emitter layer in the longitudinal direction to the ohmic contact interface with respect to the longitudinal direction of the emitter layer is 5 times or more the difference in dimension with respect to the width direction of the emitter layer between the emitter layer and the ohmic contact interface in both end portions of the emitter layer in the longitudinal direction.

4. The semiconductor device according to claim 1, wherein a distance from an end portion of the emitter layer in the longitudinal direction to the ohmic contact interface with respect to the longitudinal direction of the emitter layer is 3 μm or more in at least one end portion of the emitter layer in the longitudinal direction.

5. The semiconductor device according to claim 2, wherein a distance from an end portion of the emitter layer in the longitudinal direction to the ohmic contact interface with respect to the longitudinal direction of the emitter layer is 3 μm or more in at least one end portion of the emitter layer in the longitudinal direction.

6. The semiconductor device according to claim 3, wherein the distance from the end portion of the emitter layer in the longitudinal direction to the ohmic contact interface with respect to the longitudinal direction of the emitter layer is 3 μm or more in at least one end portion of the emitter layer in the longitudinal direction.

7. A semiconductor device comprising:
a collector layer, a base layer, and an emitter layer that are disposed on a substrate to form a bipolar transistor;
an emitter electrode that is in ohmic contact with the emitter layer; and
an emitter wiring line connected to the emitter electrode through a contact hole formed in an insulating film,
wherein
the emitter layer has a shape that is long in one direction, and
in at least one end portion of the emitter layer, an emitter access resistance which is an electrical resistance from a junction interface between the emitter layer and the base layer to the emitter electrode is 5 times or more the emitter access resistance in a central portion of the emitter layer.

8. The semiconductor device according to claim 7, wherein the emitter access resistance is constituted by the emitter layer.

* * * * *